United States Patent
Sambi et al.

(10) Patent No.: US 10,535,767 B2
(45) Date of Patent: Jan. 14, 2020

(54) ELECTRONIC JUNCTION DEVICE WITH A REDUCED RECOVERY TIME FOR APPLICATIONS SUBJECT TO THE CURRENT RECIRCULATION PHENOMENON AND RELATED MANUFACTURING PROCESS

(71) Applicant: STMICROELECTRONICS S.R.L., Agrate Brianza (IT)

(72) Inventors: Marco Sambi, Cornaredo (IT); Fabrizio Fausto Renzo Toia, Busto Arsizio (IT); Marco Marchesi, Borgonovo V.T. (IT); Marco Morelli, Bareggio (IT); Riccardo Depetro, Domodossola (IT); Giuseppe Barillaro, Pisa (IT); Lucanos Marsilio Strambini, San Giuliano Terme (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/264,384

(22) Filed: Jan. 31, 2019

(65) Prior Publication Data

US 2019/0165170 A1    May 30, 2019

Related U.S. Application Data

(62) Division of application No. 15/457,799, filed on Mar. 13, 2017, now Pat. No. 10,236,378.

(30) Foreign Application Priority Data

Aug. 30, 2016   (IT) .................. 102016000088211

(51) Int. Cl.
*H01L 21/02* (2006.01)
*H01L 29/78* (2006.01)
(Continued)

(52) U.S. Cl.
CPC .... *H01L 29/7827* (2013.01); *H01L 21/02233* (2013.01); *H01L 21/26513* (2013.01);
(Continued)

(58) Field of Classification Search
CPC .......... H01L 29/7827; H01L 21/26513; H01L 21/3063; H01L 21/3081; H01L 21/76224;
(Continued)

(56) References Cited

U.S. PATENT DOCUMENTS 5,294,825 A    3/1994 Nakagawa et al.
2005/0282375 A1   12/2005 Nitta et al.
(Continued)

OTHER PUBLICATIONS

Allard, B. et al., "On the Role of the N-N+ Junction Doping Profile of a PIN Diode on Its Turn-Off Transient Behavior," IEEE Transactions on Power Electronics 23(1):491-494, Jan. 2008.
(Continued)

*Primary Examiner* — Elias Ullah
(74) *Attorney, Agent, or Firm* — Seed Intellectual Property Law Group LLP

(57) ABSTRACT

A process of forming integrated electronic device having a semiconductor body includes: forming a first electrode region having a first type of conductivity; forming a second electrode region having a second type of conductivity, which forms a junction with the first electrode region; and forming a nanostructured semiconductor region, which extends in one of the first and second electrode regions.

20 Claims, 31 Drawing Sheets

(51) Int. Cl.
*H01L 29/32* (2006.01)
*H01L 29/66* (2006.01)
*H01L 29/861* (2006.01)
*H01L 29/06* (2006.01)
*H01L 29/16* (2006.01)
*H01L 21/265* (2006.01)
*H01L 21/3063* (2006.01)
*H01L 21/308* (2006.01)
*H01L 21/762* (2006.01)
*H01L 29/08* (2006.01)
*H01L 29/36* (2006.01)
*H01L 29/417* (2006.01)
*H03K 17/687* (2006.01)

(52) U.S. Cl.
CPC ...... *H01L 21/3063* (2013.01); *H01L 21/3081* (2013.01); *H01L 21/76224* (2013.01); *H01L 29/0649* (2013.01); *H01L 29/0653* (2013.01); *H01L 29/0665* (2013.01); *H01L 29/0847* (2013.01); *H01L 29/16* (2013.01); *H01L 29/32* (2013.01); *H01L 29/36* (2013.01); *H01L 29/41741* (2013.01); *H01L 29/66128* (2013.01); *H01L 29/66666* (2013.01); *H01L 29/66681* (2013.01); *H01L 29/7816* (2013.01); *H01L 29/8611* (2013.01); *H03K 17/687* (2013.01); *H01L 21/02255* (2013.01)

(58) Field of Classification Search
CPC ............. H01L 29/0649; H01L 29/0665; H01L 29/0847; H01L 29/36
See application file for complete search history.

(56) References Cited

U.S. PATENT DOCUMENTS

| | | |
|---|---|---|
| 2008/0246055 A1 | 10/2008 | Schulze et al. |
| 2010/0001790 A1 | 1/2010 | Hashimoto et al. |
| 2012/0098030 A1 | 4/2012 | Schulze et al. |
| 2012/0267679 A1 | 10/2012 | Menard |
| 2013/0075877 A1 | 3/2013 | Sakai et al. |

OTHER PUBLICATIONS

Benda, H. et al., "Reverse Recovery Processes in Silicon Power Rectifiers," Proceedings of the IEEE 55(8):1331-1354, Aug. 1967.

Domeij, M. et al., "On the Destruction Limit of Si Power Diodes During Reverse Recovery With Dynamic Avalanche," IEEE Transactions on Electron Devices 50(2):486-493, Feb. 2003.

Egawa, H., "Avalanche Characteristics and Failure Mechanism of High Voltage Diodes," IEEE Transactions on Electron Devices 13(11):754-758, Nov. 1996.

Hower, P. et al., "Reverse-Recovery Safe Operating Area of Didoes in Power Integrated Circuits," Proceedings of the 2012 24th International Symposium on Power Semiconductor Devices and ICs, Bruges, Belgium, 4 pgs., Jun. 3-7, 2012.

ELECTRONIC JUNCTION DEVICE WITH A REDUCED RECOVERY TIME FOR APPLICATIONS SUBJECT TO THE CURRENT RECIRCULATION PHENOMENON AND RELATED MANUFACTURING PROCESS

BACKGROUND

Technical Field

The present disclosure relates to an electronic junction device with reduced recovery time. In particular, the present electronic device is suited to being used, for example, in the case of applications that are potentially subject to the so-called current recirculation phenomenon, and more in general in the case of applications that envisage subjecting the electronic device to fast voltage variations.

Description of the Related Art

As is known, the so-called current recirculation phenomenon occurs, for example, when an electronic output stage is connected to a (desired or parasitic) inductive load.

For instance, FIG. 1 shows a control stage 2, which includes a first transistor 4 and a second transistor 6, as well as a first diode D1, a second diode D2, a third diode D3, a fourth diode D4, a fifth diode D5, and a sixth diode D6.

In detail, the first transistor 4 is a power MOSFET of a P-MOS type and includes the fifth diode D5. The cathode and the anode of the fifth diode D5 are connected, respectively, to the source terminal and the drain terminal of the first transistor 4. Further, the source terminal of the first transistor 4 is set at a first (positive) supply voltage $V_+$, whereas the drain terminal is connected to the anode of the third diode D3, the cathode of which forms a node N.

The second transistor 6 is a power MOSFET of an N-MOS type and includes the sixth diode D6. The cathode and the anode of the sixth diode D6 are connected, respectively, to the drain terminal and the source terminal of the second transistor 6. Further, the source terminal of the second transistor 6 is set at a second (negative or zero) supply voltage $V_-$, whereas the drain terminal is connected to the cathode of the fourth diode D4, the anode of which is connected to the node N.

The anode and the cathode of the first diode D1 are connected, respectively, to the node N and to the source terminal of the first transistor 4. Further, the cathode and the anode of the second diode D2 are connected, respectively, to the node N and to the source terminal of the second transistor 6.

The node N is electrically connected, for example, to a metal pad 10. In this connection, the third and fourth diodes D3 and D4 have the function of preventing, in the case where the first transistor 4 and/or the second transistor 6 are/is off, a possible signal coming, through the metal pad 10, from the outside world from traversing the fifth and sixth diodes D5, D6.

Once again in relation to the metal pad 10, it is electrically connected to a load formed by a series circuit, which in turn includes an inductor L and a resistor R.

In use, the first and second transistors 4, 6 are controlled, through their respective gate terminals, to not be simultaneously in conduction. This being said, assuming that the first transistor 4 is in conduction, in the first diode D1 no current flows. Further, the second diode D2 withstands the voltage present between the voltage on the node N and the voltage $V_-$, but no current flows inside it either. In these conditions, a certain current flows in the load, and thus in the inductor L and in the resistor R.

Next, while the second transistor 6 remains off, the first transistor 4 is switched off. In these conditions, the inductor L tends to maintain the current that traversed it when the first transistor 4 was on. This current is, however, supplied, now, by the second diode D2, for a certain period of time. Next, the second transistor 6 is switched on and sends the voltage of the node N to a value approximately equal to V. The current continues to flow in the second diode D2 until the inductor L has exhausted the energy stored during the previous conduction step. Once said energy is exhausted, the inductor L is traversed by a current having a direction opposite to that of the previous conduction step, this current further flowing through the fourth diode D4 and the second transistor 6. In these conditions, the second diode D2 starts to switch off.

This being said, if, before the second diode D2 is completely off (i.e., is without any charge stored), the second transistor 6 is switched off, and then the first transistor 4 is switched on again, the voltage on the node N rises. In other words, the first transistor 4 tends to force the second diode D2 to operate in a reverse-biasing mode. However, the second diode D2 is not yet off and must in any case withstand the voltage present on the node N. In these conditions, the second diode D2 may be subject to failure since the voltage across the second diode D2 may be withstood only by the portions of the second diode D2 without carriers.

A qualitative example of the plot of the current in the second diode D2 is shown in FIG. 2, where V is the voltage on the node N, which at a first instant $t_1$ switches from a value approximately equal to $V_+$ to a value approximately equal to $V_-$, and at a subsequent second instant $t_2$ switches from the value approximately equal to V- to the value approximately equal to $V_+$. Further, FIG. 2 also shows the plot of the current (designated by I) that flows in the second diode D2, on the hypothesis that, at an instant $t_0$ previous to the first instant $t_1$, the first transistor 4 is switched off and the current I is equal to a value $I_D$. This being said, between the instant $t_0$ and the second instant $t_2$, the current I decreases. However, at the second instant $t_2$, i.e., at the instant when, after the second transistor 6 has been switched off, the first transistor 4 is switched on again, the current I is not completely zero, or in any case (case not illustrated) the second diode D2 is not completely depleted, i.e., is not completely off. For this reason, subsequent to the second instant $t_2$, the current I decreases sharply, on account of the charge still stored in the second diode D2, until it reverses its own direction. In particular, at a third instant $t_3$, the second diode D2 is traversed by a reverse current equal to $I_R$, which then vanishes at a fourth instant $t_4$ (the depletion curve is shown in FIG. 2 in a particularly simplified way, for the sole purpose of facilitating understanding). In practice, it may happen that, between the second instant $t_2$ and the third instant $t_3$, failure of the second diode D2 occurs. Similar considerations apply, more in general, also to the case where a so-called current recirculation does not occur, but a diode that is not completely off is in any case subject to sudden voltage variations.

In general, it may occur that the so-called dynamic breakdown voltage, i.e., the reverse voltage that may be withstood by a diode when the reverse biasing is applied after a step of forward biasing and without waiting for turning-off of the diode, is decidedly lower than the static breakdown voltage. The dynamic breakdown voltage depends upon the current that has flowed during forward biasing and upon the voltage variation to which the diode is subject.

In addition, the problem of turning-off of a forward-biased diode is strictly correlated with the so-called recovery time, which in turn depends, amongst other things, upon how the charge is stored within the diode. The longer the recovery time, the greater the likelihood of failure of a diode, when it is used in applications of the type described above.

Even more in general, the previous considerations may be extended to the case of any integrated electronic component, which includes at least one PN junction, which, as is known, forms a corresponding diode.

In order to reduce the recovery time of a diode, some solutions have been proposed, which are effective in the case of discrete diodes. In particular, it has been proposed to introduce recombination centers in the semiconductor in order to accelerate recombination of the excess carriers, i.e., absorption of the charge accumulated during conduction. For this purpose, it is possible to carry out an implantation of ions of heavy metals, or else irradiate with high-power radiation the semiconductor body. In this way, the lifetime of the carriers is reduced. Such solutions are particularly advantageous in the case of discrete diodes. However, they are substantially impracticable in the case of multi-component devices integrated in dice, for example with bipolar-CMOS-DMOS (BCD) technology, which, as is known, is a technology (also known as "smart-power technology") that enables integration in a same die of bipolar transistors, CMOS transistors, and DMOS transistors. In fact, in the case of implantation of metal ions, the latter tend to diffuse, contaminating the entire semiconductor wafer; in the case, instead, of irradiation at high energy, it entails an increase of the leakage currents with the device turned off.

BRIEF SUMMARY

One embodiment of the present disclosure is an integrated electronic device that solves at least in part the drawbacks of the known art.

According to at least some embodiments of the present disclosure, an integrated electronic device includes:
a semiconductor body;
a first electrode region, having a first type of conductivity, in the semiconductor body;
a second electrode region having a second type of conductivity in the semiconductor body, the second electrode region forming a junction with the first electrode region; and
a nanostructured semiconductor region which extends in one of the first and second electrode regions.

According to at least some embodiments of the present disclosure, a corresponding process manufactures an integrated electronic device. The process includes:
forming a first electrode region, having a first type of conductivity, in a semiconductor body;
forming a second electrode region, having a second type of conductivity, in the semiconductor body, the second electrode region forming a junction with the first electrode region; and
forming a nanostructured semiconductor region extending in one of the first and second electrode regions.

BRIEF DESCRIPTION OF THE SEVERAL VIEWS OF THE DRAWINGS

For a better understanding of the present disclosure, preferred embodiments thereof are now described, purely to way of non-limiting example and with reference to the attached drawings, wherein.

DETAILED DESCRIPTION

The present disclosure stems from an observation made by the present inventor, who has noted how a conversion into nanostructured material of a part of the semiconductor material that forms the structure of a diode improves the levels of performance of the diode itself, in particular as regards (static and dynamic) breakdown and recovery time.

Figure 3A:
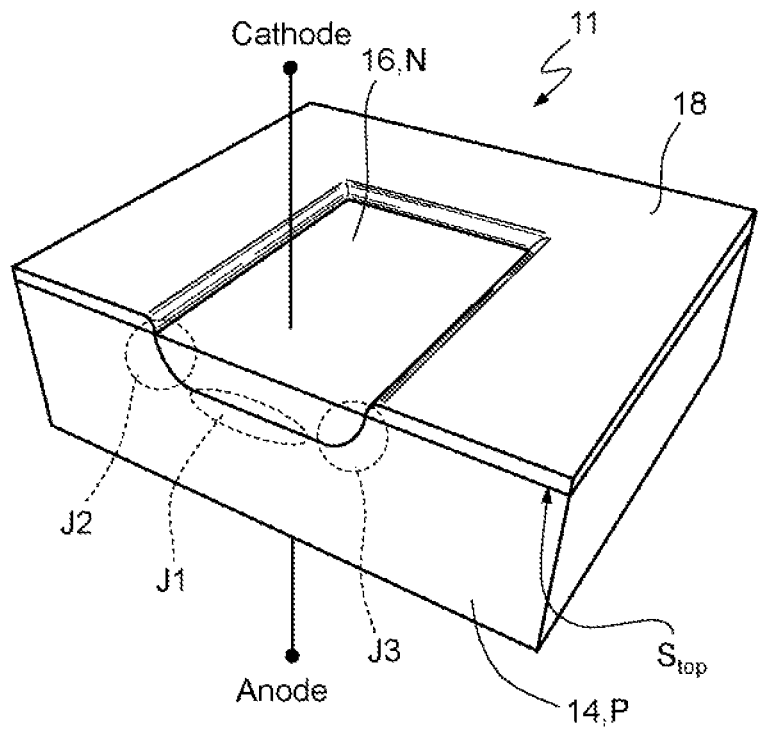
FIGS. 3a and 3b are schematic perspective views of portions of diodes.
Figure 3B:
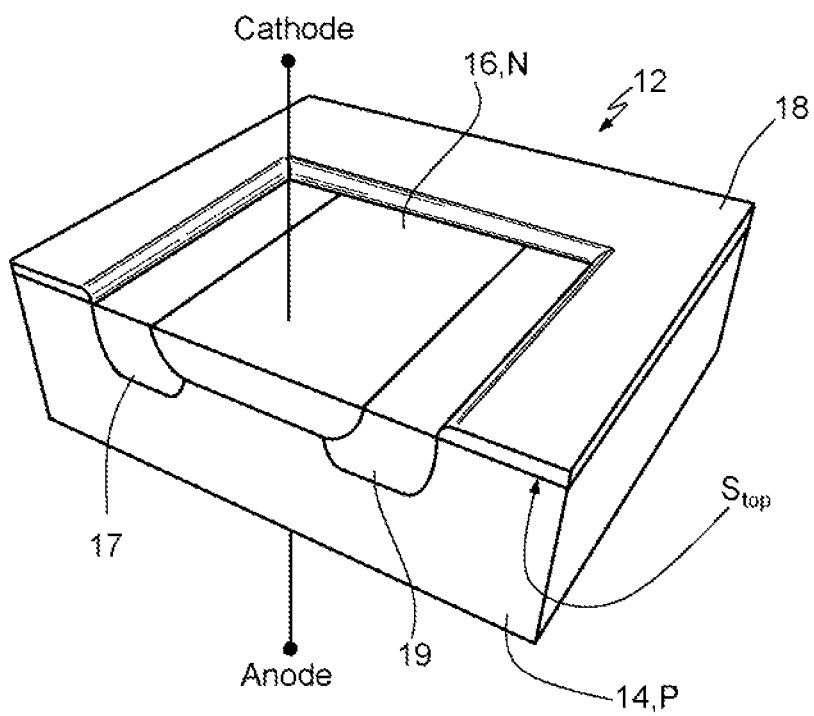

In detail, FIGS. 3A and 3B (which are not in scale, as neither are the subsequent figures) show, respectively, a traditional diode 11 and an improved diode 12, which are both of silicon.

The traditional diode 11 comprises a semiconductor base region 14 of a P type, delimited by a respective surface $S_{top}$. A cathode-electrode semiconductor region 16 of an N type extends within the semiconductor base region 14, starting from the surface $S_{top}$, whereas a field-oxide region 18 extends over the surface $S_{top}$ for leaving the cathode-electrode semiconductor region 16 exposed.

As shown once again in FIG. 3a, a central portion of the cathode-electrode semiconductor region 16 forms, together with an underlying portion of the semiconductor base region 14, a first junction portion J1, which is substantially planar. Two peripheral portions of the cathode-electrode semiconductor region 16 form, together with corresponding adjacent portions of the semiconductor base region 14, a second junction portion J2 and a third junction portion J3, which are of a curved and lateral type. In practice, the first junction portion J1 forms a respective diode, whereas the second and third junction portions J2, J3 form further diodes, arranged in parallel to the diode formed by the first junction portion J1.

The improved diode 12 comprises, instead, a first additional region 17 and a second additional region 19 of nanostructured silicon, i.e., of porous silicon, which has nanocavities. The first and second additional regions 17, 19 extend in the semiconductor base region 14 starting from the surface $S_{top}$, on opposite sides of the cathode-electrode semiconductor region 16, with which they are in direct contact. In this way, instead of the aforementioned second and third junction portions J2, J3, crystalline-silicon/nanostructured-silicon interfaces are present, which have a markedly resistive behavior.

In practice, the improved diode 12 forms once again the first junction portion J1, and thus the corresponding diode, but no longer forms the diode corresponding to the second and third junction portions J2, J3. Further, the presence of the first and second additional regions 17, 19 makes it possible to speed up absorption of the excess carriers during the on-off transition, without damaging forward-biasing operation of the improved diode 12. In addition, the presence of the first and second additional regions 17, 19 makes it possible to reduce the so-called leakage current and to maintain a high value of static breakdown voltage, without damage to forward-biasing operation of the improved diode 12.

Figure 4A:
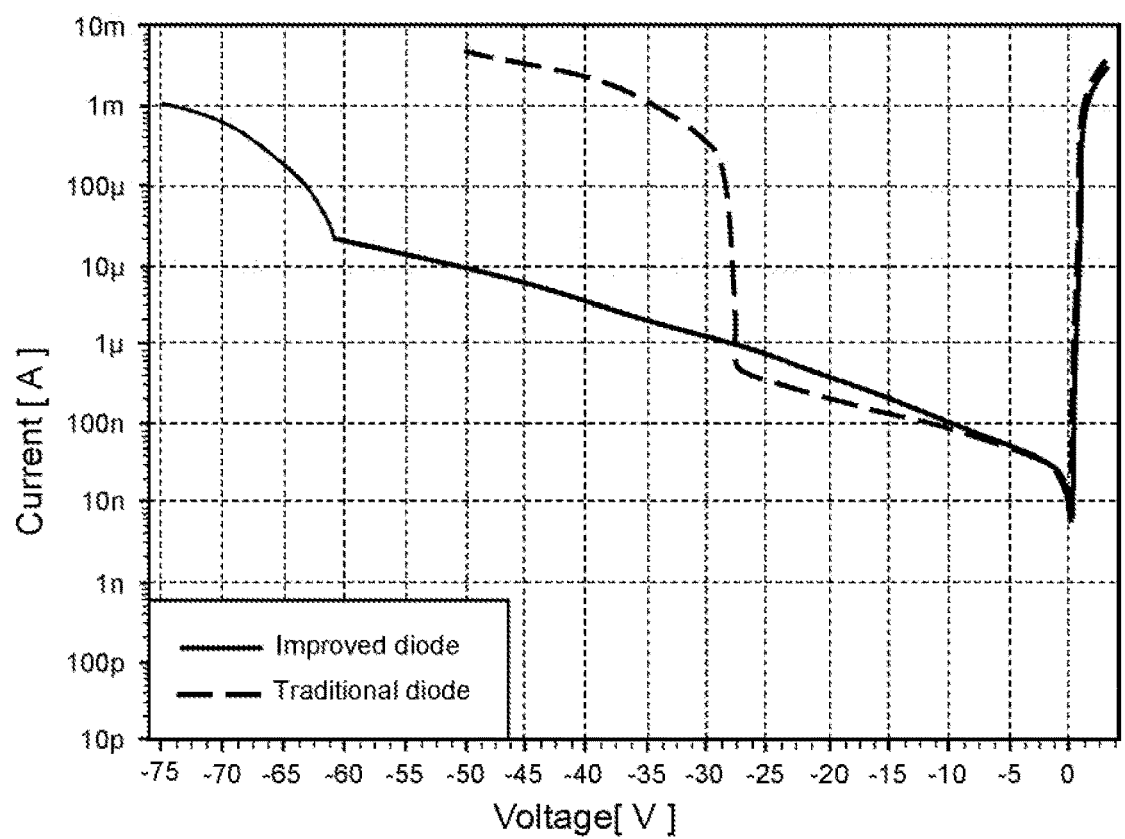
FIG. 4a shows plots of currents that flow in two different diodes, as a function of the voltage.
Figure 4B:
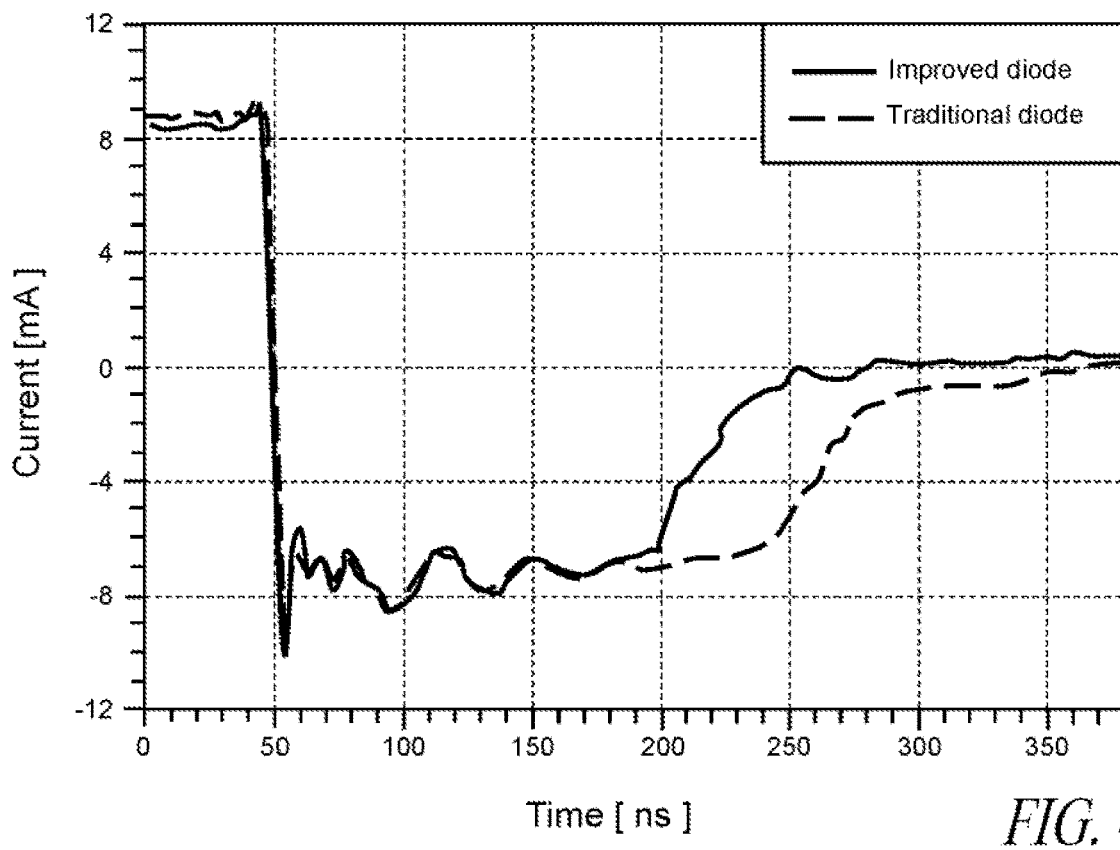
FIG. 4b shows time plots of currents that flow in two different diodes.

For instance, FIG. 4A shows the plots, as a function of the voltage, of the currents that flow in the traditional diode 11 and in the improved diode 12. From these plots it may be noted how the modulus of the static breakdown voltage, which occurs at a knee of the current curve, is approximately 28 V and 61 V, respectively, in the case of the traditional diode 11 and of the improved diode 12. Further, FIG. 4B shows the time plots of the currents that flow in the traditional diode 11 and in the improved diode 12, when each of them is traversed by a forward current and is subsequently turned off, limiting the reverse current to values similar to those of the conduction that has just terminated. In particular, FIG. 4B highlights a reduction of the turning-off time of the improved diode 12 as compared to the traditional diode 11.

Figure 5:
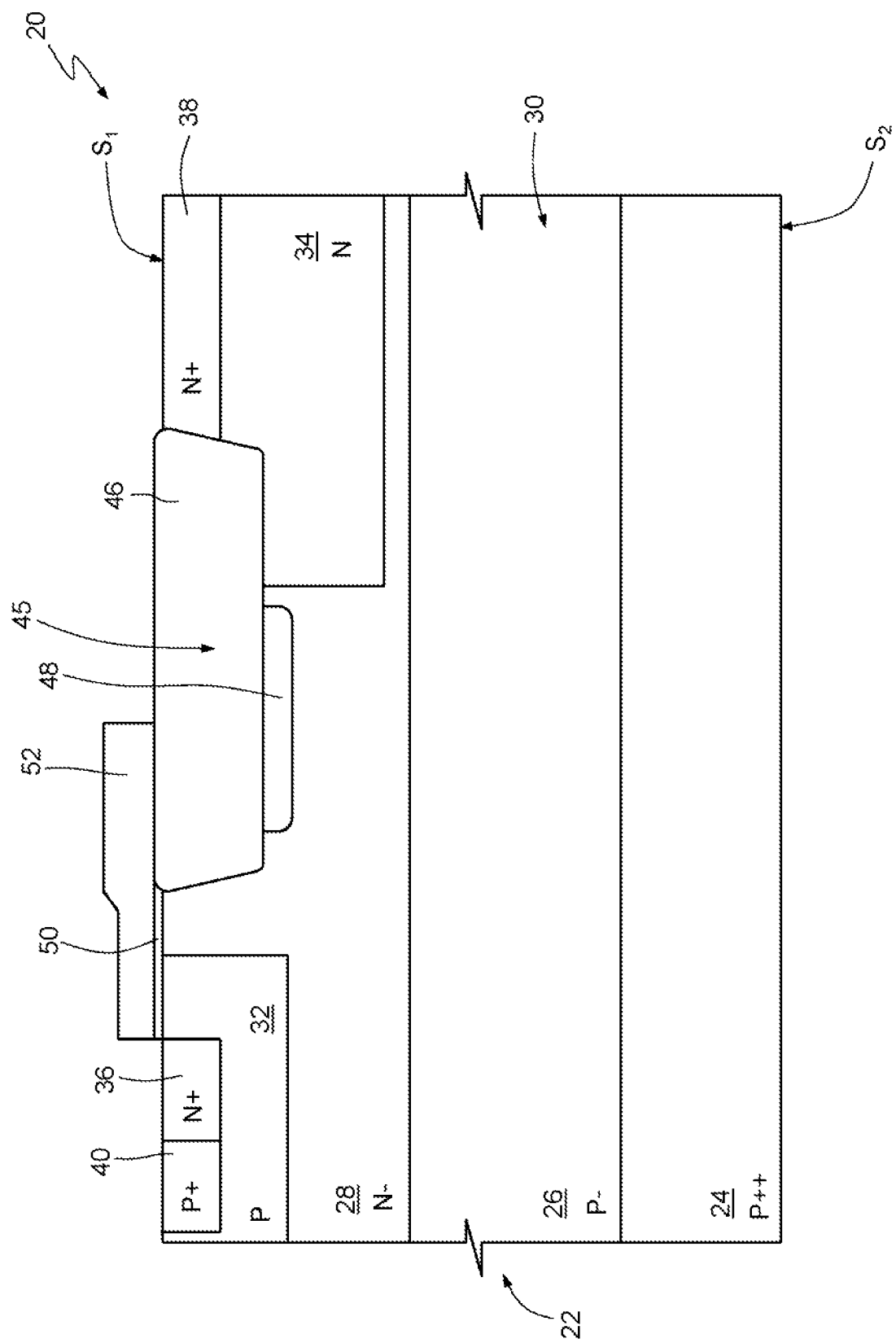
FIG. 5 is a schematic cross-sectional view of a transistor.

All this having been said, FIG. 5 shows a MOSFET 20, which is integrated in a die 22.

In detail, the die 22 comprises a substrate 24 of semiconductor material (for example, silicon) of a P++ type and an epitaxial layer 26 of a P− type, which overlies the substrate 24. Further, the die 22 comprises an implanted layer 28 of an N− type, which overlies the epitaxial layer 26.

Purely by way of example, the substrate 24, the epitaxial layer 26, and the implanted layer 28 may have levels of doping comprised in the intervals $[10^{17}, 10^{20}]$, $[10^{14}, 10^{17}]$, and $[10^{14}, 10^{18}]$ cm$^{-3}$, respectively. Further, the substrate 24, the epitaxial layer 26, and the implanted layer 28 may have thicknesses comprised, for example, in the intervals [20 μm, 700 μm], [0.1 μm, 50 μm], and [0.1 μm, 5 μm], respectively.

In practice, the substrate 24, the epitaxial layer 26, and the implanted layer 28 form a semiconductor body 30, which is made, for example, of silicon. Further, the semiconductor body 30 is delimited at the top and at the bottom, respectively, by a top surface $S_1$, formed by the implanted layer 28, and by a bottom surface $S_2$, formed by the substrate 24.

The MOSFET 20 further comprises a body region 32 of a P type, which extends in the implanted layer 28 starting from the top surface $S_1$. In particular, in the embodiment shown in FIG. 5, the body region 32 extends in a top portion of the implanted layer 28.

The MOSFET 20 further comprises a well 34 of an N type, which extends within the implanted layer 28, starting from the top surface $S_1$. In particular, in the embodiment shown in FIG. 5, the well 34 extends in a top portion of the implanted layer 28, which is laterally spaced apart with respect to the portion of implanted layer 28 in which the body region 32 extends.

By way of example, the body region 32 and the well 34 may have levels of doping of $10^{15}$ and $10^{18}$ cm$^{-3}$, respectively.

The MOSFET 20 further comprises a source region 36, a drain region 38, and a body contact region 40.

In detail, the source region 36 is of an N+ type and extends within the body region 32, starting from the top surface $S_1$.

The body contact region 40 is of a P+ type and extends within the body region 32, starting from the top surface $S_1$. Further, the body contact region 40 is positioned laterally with respect to the source region 36. More in particular, the body contact region 40 laterally contacts the source region 36.

The drain region 38 is of an N+ type and extends within the well 34, starting from the top surface $S_1$.

The MOSFET 20 implements a shallow-trench-insulation (STI) structure. In particular, the MOSFET 20 comprises a trench 45, which extends within the semiconductor body 30 starting from the top surface $S_1$.

In greater detail, the trench 45 traverses a portion of the implanted layer 28 arranged between the body region 32 and the well 34. Further, the trench 45 traverses portions of the well 34 and of the drain region 38.

In even greater detail, the trench 45 is arranged between the body region 32 and the drain region 38. Further, the trench 45 is arranged at a distance from the body region 32 and contacts the drain region 38, the well 34, and the implanted layer 28.

Present within the trench 45 is an insulation region 46, formed by dielectric material and described in greater detail hereinafter. The insulation region 46 contributes to withstanding the drain-to-source voltage of the MOSFET 20.

The MOSFET 20 further comprises a nanostructured region 48, which extends in the implanted layer 28 starting from the bottom of the trench 45, contacting the insulation region 46.

In detail, the nanostructured region 48 is of the same semiconductor material as the one that forms the semiconductor body 30 (for example, silicon), but is porous; i.e., it has a plurality of nanocavities (not shown). In greater detail, the nanocavities of the nanostructured region 48 may be empty, or else may be filled with an inert gas, or else again may be filled in part with an inert gas and in part with a solid material (for example, oxide). Further, the nanocavities may have an approximately spherical shape, with a diameter comprised between 1 μm and 100 μm. It is, however, possible for the nanocavities to have a non-spherical shape, with an equivalent diameter comprised, for example, between 1 μm and 100 μm.

The nanostructured region 48 thus has a resistivity higher than the resistivity of the other semiconductor regions of the semiconductor body 30.

The MOSFET 20 further comprises a gate-oxide region 50, of dielectric material, and a gate region 52, of conductive material (for example, polysilicon).

In detail, the gate-oxide region 50 extends over the top surface $S_1$ for contacting a portion of the body region 32, which is arranged laterally with respect to the source region 36 and extends to the top surface $S_1$. Further, the gate-oxide region 50 contacts a portion of the implanted layer 28, which is arranged between the body region 32 and the insulation region 46 and extends to the top surface $S_1$. In addition, the gate-oxide region 50 extends laterally until it contacts the insulation region 46.

Albeit not shown in FIG. 5, the MOSFET 20 further comprises: a gate metallization, which contacts the gate region 52; and a source metallization, which contacts the source region 36. Further, the MOSFET 20 may comprise a drain metallization (not shown), which contacts the drain region 38, and a body metallization (not shown), which contacts the body contact region 40 and may coincide with the source metallization. In addition, albeit not shown in FIG. 5, the MOSFET 20 comprises a passivation region, which is of dielectric material and extends over the top surface $S_1$, for overlying, among other things, the gate region 52, the insulation region 46, and the aforementioned metallizations.

In use, the MOSFET 20 is biased so that in a portion of the body region 32 arranged in contact with the gate-oxide region 50 a conductive channel is formed. More in particular, the MOSFET 20 functions as an enhancement-mode N-channel transistor.

This being said, considering the PN diode the anode region of which is formed by the body region 32, and the cathode region of which is formed by the implanted layer 28, by the well 34, and by the drain region 38, i.e., considering the body-drain diode of the MOSFET 20, it may be noted how the nanostructured region 48 extends in the cathode region. Further, the nanostructured region 48 houses recombination centers, which accelerate recombination of the excess carriers when the aforementioned body-drain diode passes from a state of forward conduction to a state of reverse biasing. Consequently, the MOSFET 20 is characterized by a faster turning-off rate and a lower energy dissipated by the body-drain diode.

In general, it is further possible, albeit not shown, for the nanostructured region 48, and in particular a portion facing the drain region 38, to extend in part within the well 34. In this case, the nanostructured region 48 extends through the interface between the implanted layer 28 and the well 34. Further possible are embodiments (not shown) in which the nanostructured region 48 extends entirely within the well 34. These embodiments guarantee to a first approximation the same advantages described with reference to the embodiment shown in FIG. 5.

Once again with reference to the embodiment shown in FIG. 5, the aforementioned advantages are further enhanced on account of the fact that the nanostructured region 48 extends in the region that exhibits the lower doping level of the aforementioned anode and cathode regions of the PN diode, i.e., in the region that, considering the two minimum levels of doping that there are, respectively, in the anode region and in the cathode region, has the lower minimum level. In fact, during forward conduction, the minority carriers accumulate above all in the regions with lower doping, and thus their subsequent recombination is particularly facilitated if the recombination centers are located close to these regions.

In general, denoting by "semiconductor electrode region with lower doping" the region from between the anode region and the cathode region that exhibits the lower doping level (for example, in the case of the embodiment shown in FIG. 5 this is the cathode region), and noting that the implanted layer 28, the well 34, and the drain region 38 form corresponding subregions of the cathode region, the following considerations apply. As mentioned previously, embodiments (not shown) are possible in which the nanostructured region 48, albeit entirely located within the semiconductor electrode region with lower doping, is arranged within a subregion of the latter that does not exhibit the aforesaid lower minimum level. However, it is possible to obtain improved levels of performance if the nanostructured region 48 extends at least in part within the subregion that exhibits the aforesaid lower minimum level. Further, a further increase of the levels of performance is obtained if this subregion that exhibits the aforesaid lower minimum level contacts the other semiconductor electrode region (in the examples described, the anode region).

Irrespective of the position of the nanostructured region 48, the embodiments described previously may be obtained employing the manufacturing process that is described in what follows, limitedly to a part of the MOSFET 20.

Figure 6:
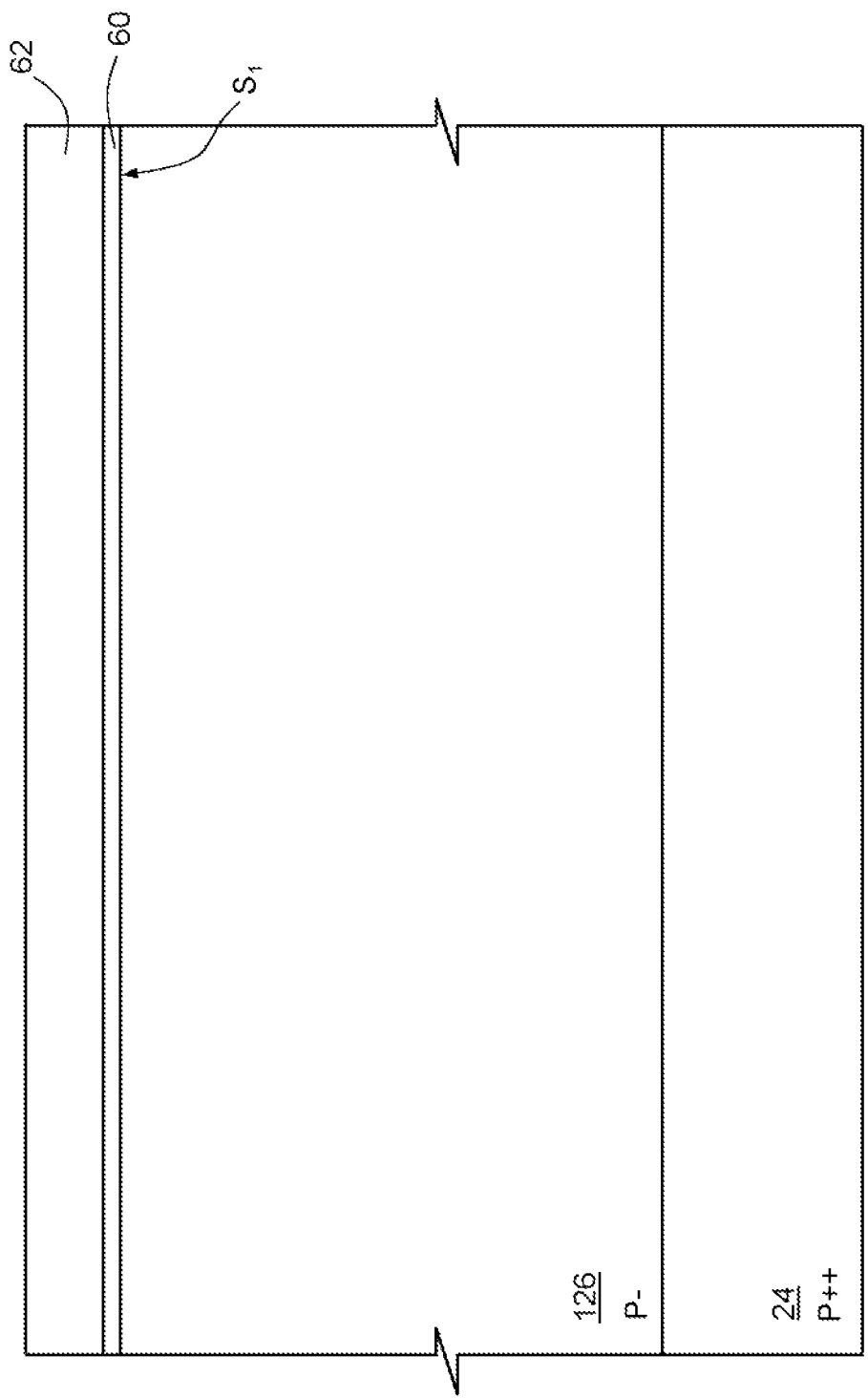
FIGS. 6-32 are schematic cross-sectional views of portions of an integrated electronic device, during successive steps of a manufacturing process.

As shown in FIG. 6, initially formed on the substrate 24 is an epitaxial region 126, which will be referred to in what follows as the preliminary epitaxial region 126. As will be clarified hereinafter, the preliminary epitaxial region 126 will form the epitaxial layer 26 and the implanted layer 28. Further, the preliminary epitaxial region 126 is delimited at the top by the top surface $S_1$.

In addition, as shown once again in FIG. 6, formed over the top surface $S_1$ is a first dielectric layer 60, made, for example, of thermal oxide. Formed on the first dielectric layer 60, by deposition, is a second dielectric layer 62, which is made, for example, of silicon nitride. In what follows, the first and second dielectric layers 60, 62 will be referred to, respectively, as the first and second dielectric process layers 60, 62.

In general, the presence of the first dielectric process layer 60 prevents formation of the second dielectric process layer 62 in direct contact with the semiconductor body 30, which would cause stresses within the semiconductor body 30. In addition, the presence of the first dielectric process layer 60 facilitates a subsequent operation of etching of the second dielectric process layer 62, described hereinafter.

Figure 7:
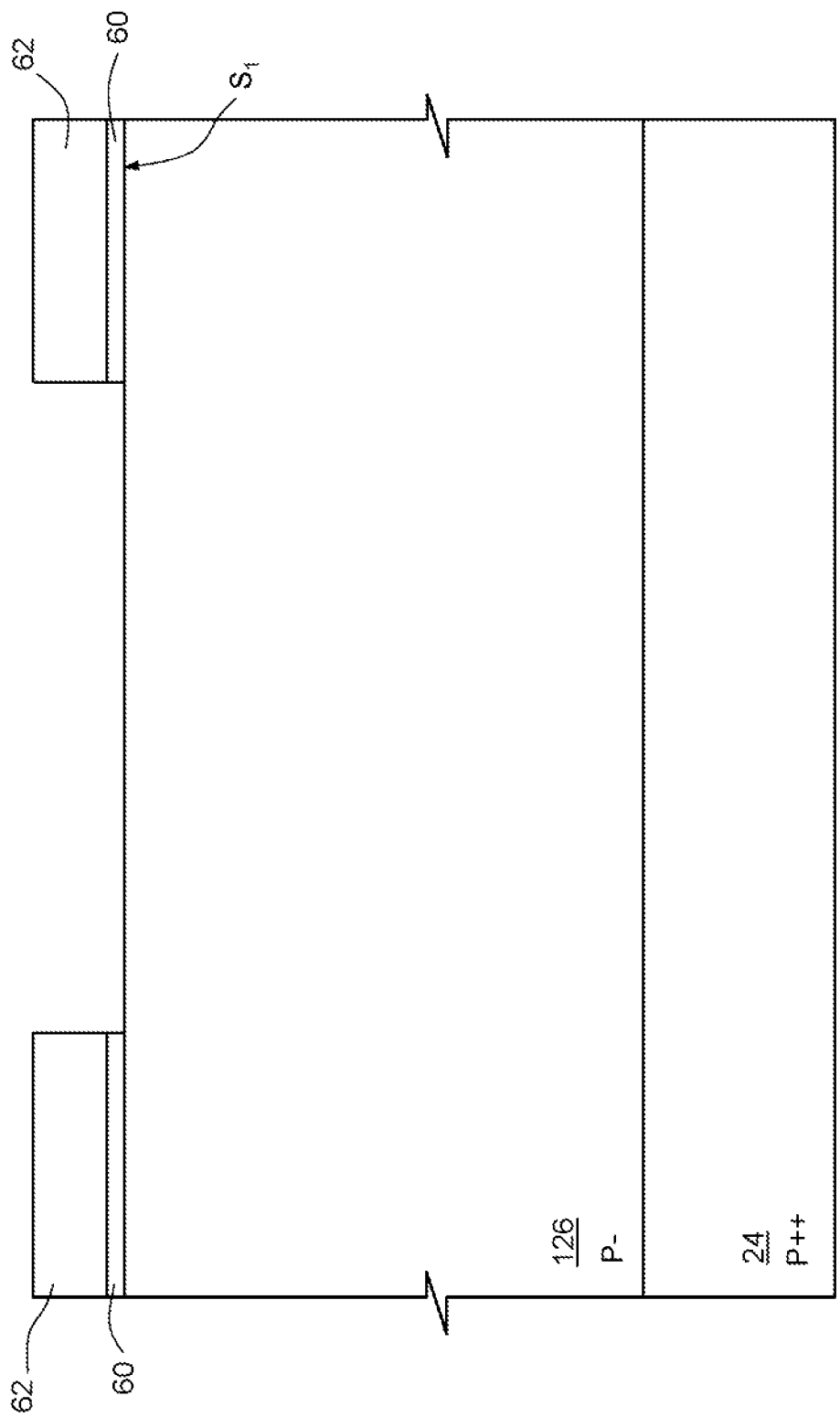

Next, as shown in FIG. 7, a photolithographic process and a subsequent double dry chemical etch are carried out in order to remove selectively a portion of the second dielectric process layer 62 and an underlying portion of the first dielectric process layer 60. In this way, a portion of the top surface $S_1$ is exposed.

Figure 8:
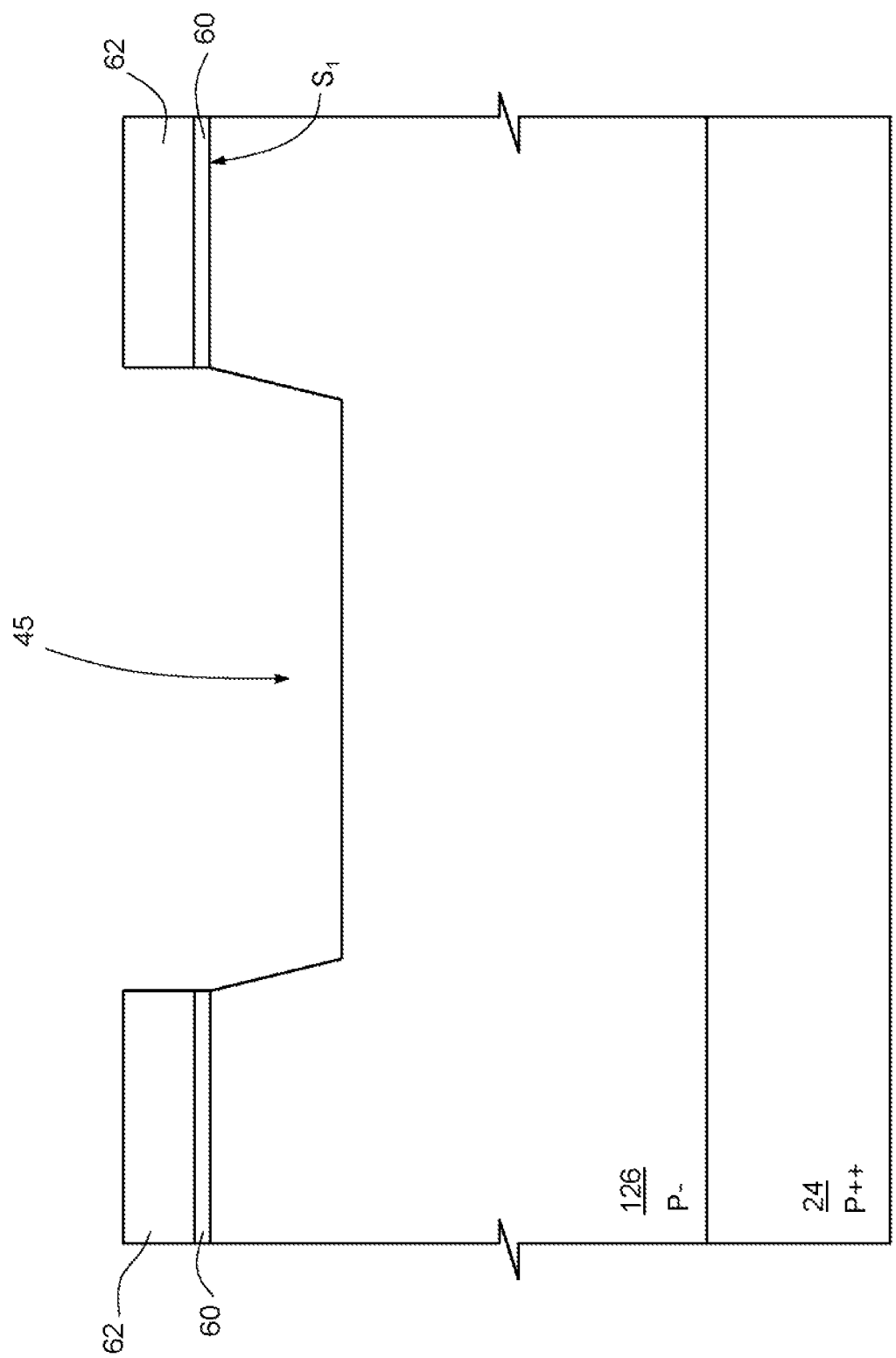

Then, as shown in FIG. 8, a further dry chemical etch is carried out, during which the remaining portions of the first and second dielectric process layers 60, 62 function as so-called hard mask. This further dry chemical etch entails selective removal of a part of the preliminary epitaxial region 126 and causes formation of the trench 45, which has a depth of, for example, 350 μm.

Figure 9:
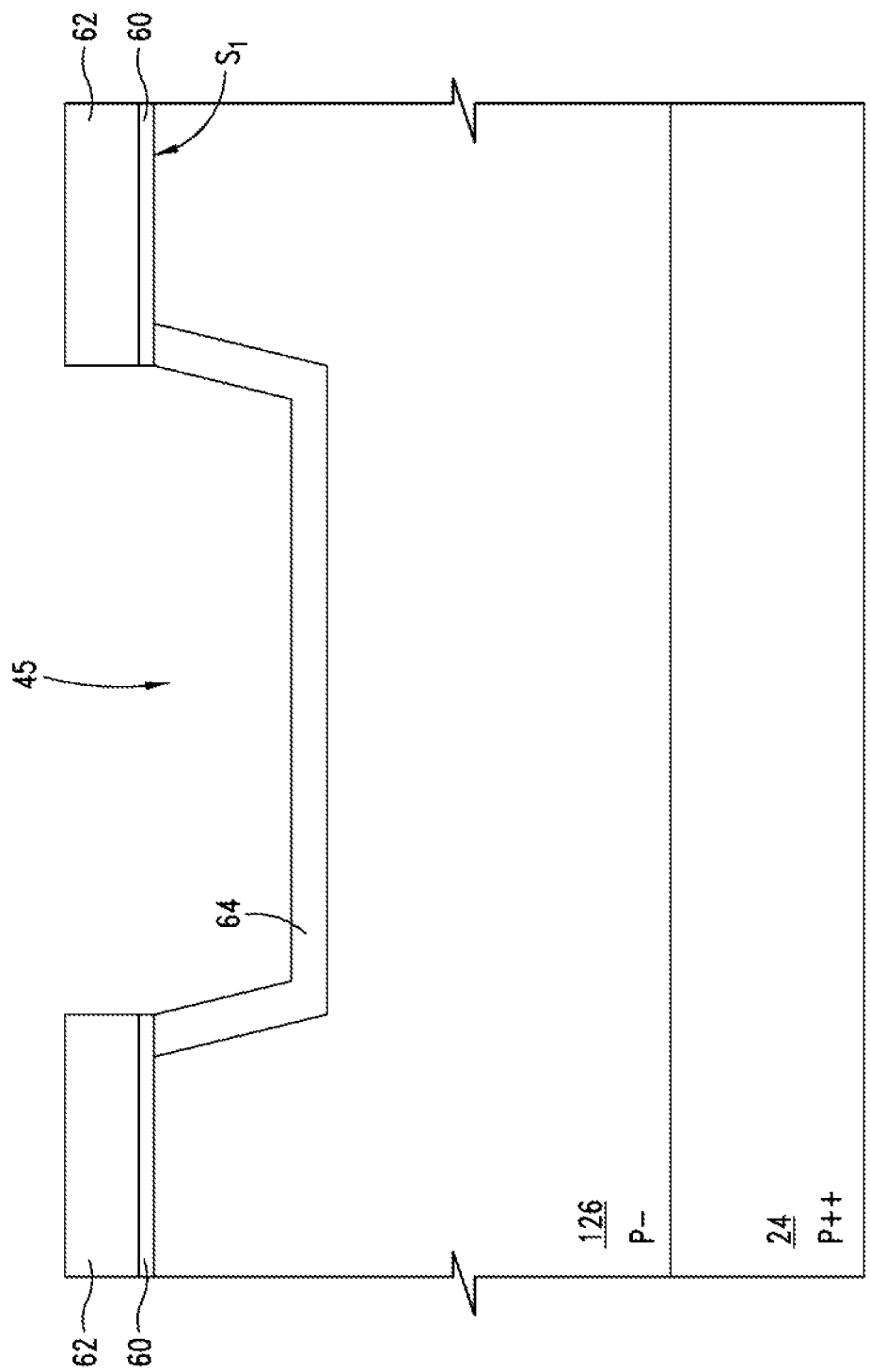

Next, as shown in FIG. 9, a process of thermal oxidation is carried out, which leads to formation of a third dielectric layer 64, of thermal oxide, which will be referred to in what follows as the outer coating layer 64.

In greater detail, the outer coating layer 64 coats the lateral walls and the bottom of the trench 45. Further, the outer coating layer 64 has a thickness of, for example, 40 μm. In addition, the outer coating layer 64 is connected to the remaining portions of the first dielectric process layer 60, with which it substantially forms a single layer, even though in FIG. 9, for greater clarity, the remaining portions of the first dielectric process layer 60 are shown as distinct from the outer coating layer 64.

Figure 10:
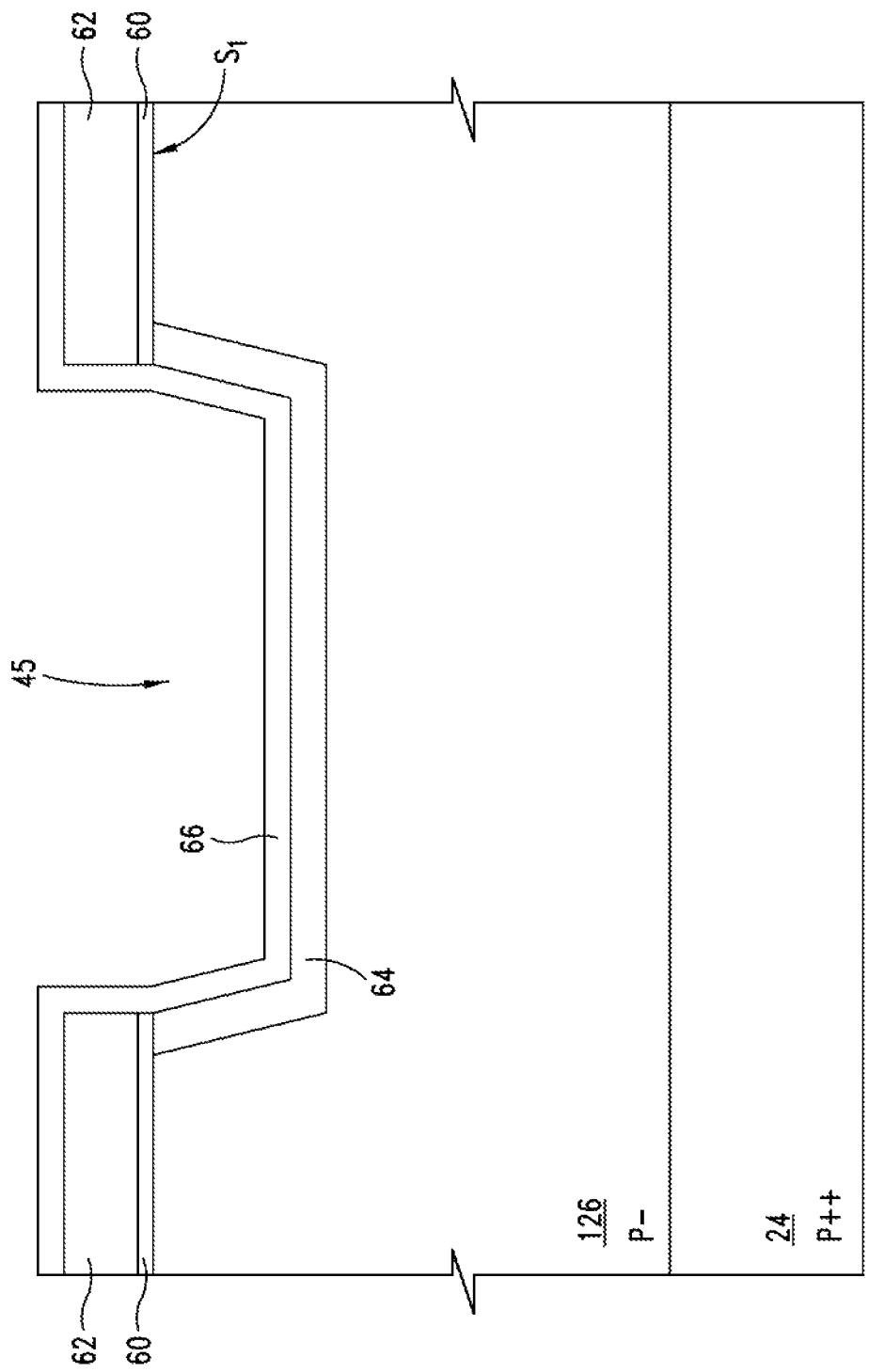

Then, as shown in FIG. 10, deposited on the surface of the device is a further dielectric layer 66, which will be referred to in what follows as the third dielectric process layer 66. The third dielectric process layer 66 is made, for example, of TEOS oxide, has a thickness of, for example, 40 μm, and extends on the remaining portions of the second dielectric process layer 62 and on the outer coating layer 64.

Figure 11:
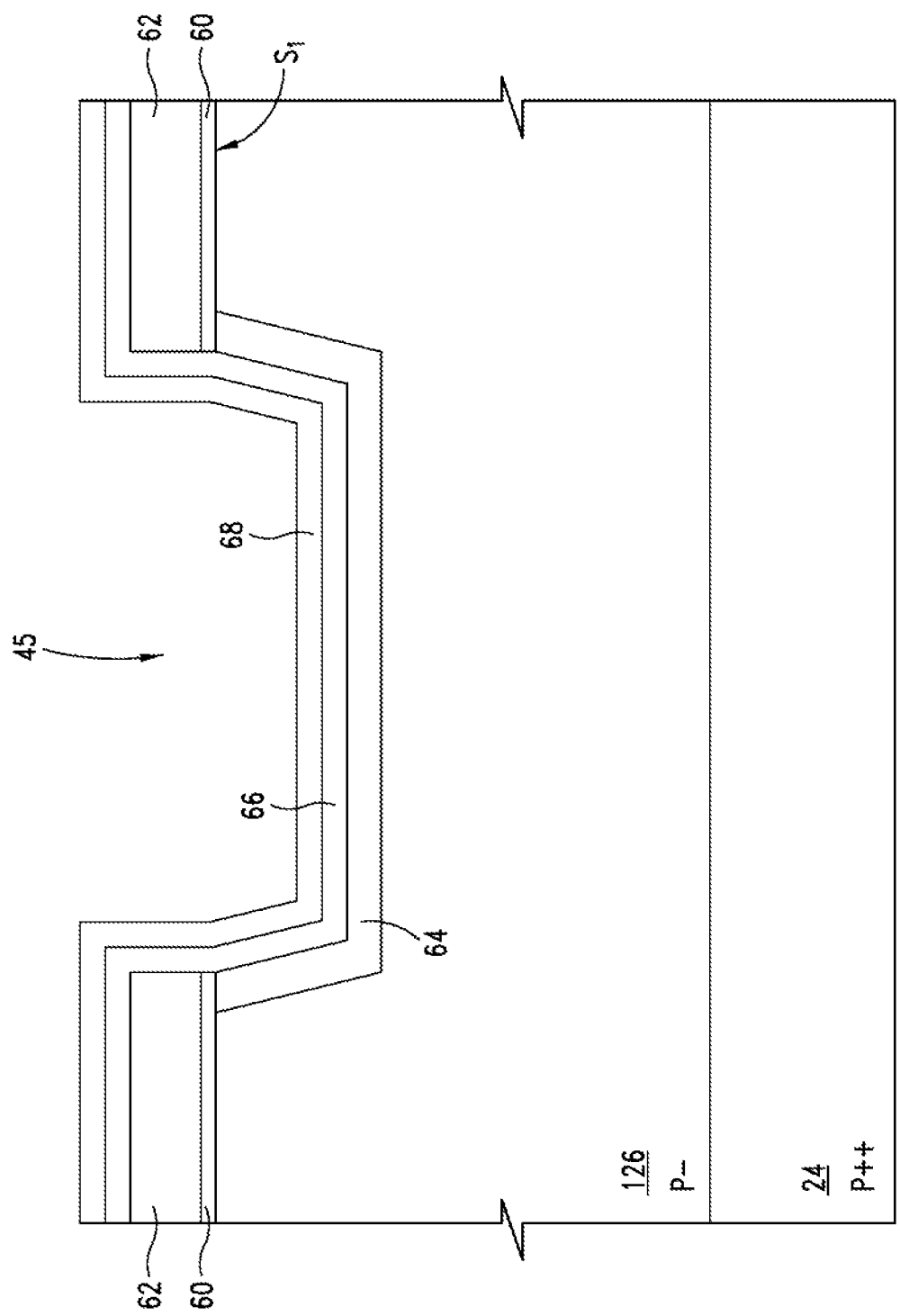

Next, as shown in FIG. 11, formed on the third dielectric process layer 66 is a further dielectric layer 68, which will be referred to in what follows as the fourth dielectric process layer 68.

In particular, the fourth dielectric process layer 68 is of silicon nitride and is formed by deposition.

Figure 12:
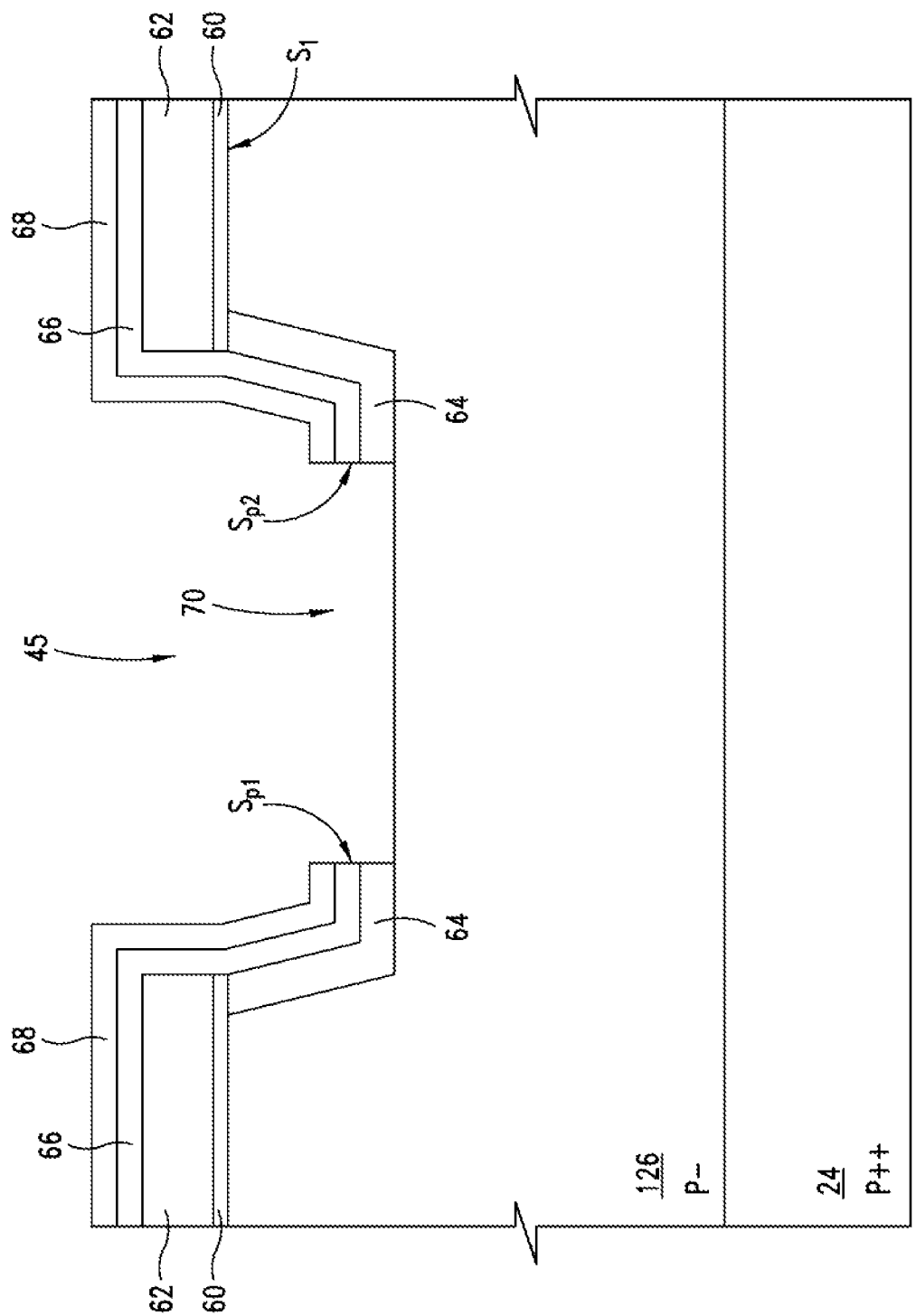

Next, as shown in FIG. 12, a photolithographic process and a subsequent triple dry etch are carried out so as to remove a portion of the fourth dielectric process layer 68 that overlies at a distance the bottom of the trench 45, as well as portions of the third dielectric process layer 66 and of the outer coating layer 64 underlying it, for forming a first window 70. In practice, the portions of the third and fourth dielectric process layers 66, 68 that have remained after the first two etches of the aforementioned triple dry etch form a sort of further hard mask for the last etch of the aforementioned triple dry etch.

The first window 70 enables a first portion of the preliminary epitaxial region 126 underlying the bottom of the trench 45 to be exposed. Further, the first window 70 is laterally delimited by a first side wall $S_{p1}$ and a second side wall $S_{p2}$, each of which is formed by corresponding exposed portions of the outer coating layer 64 and of the third dielectric process layer 66, which extend precisely to the first window 70, as well as by portions of the fourth dielectric process layer 68.

Figure 13:
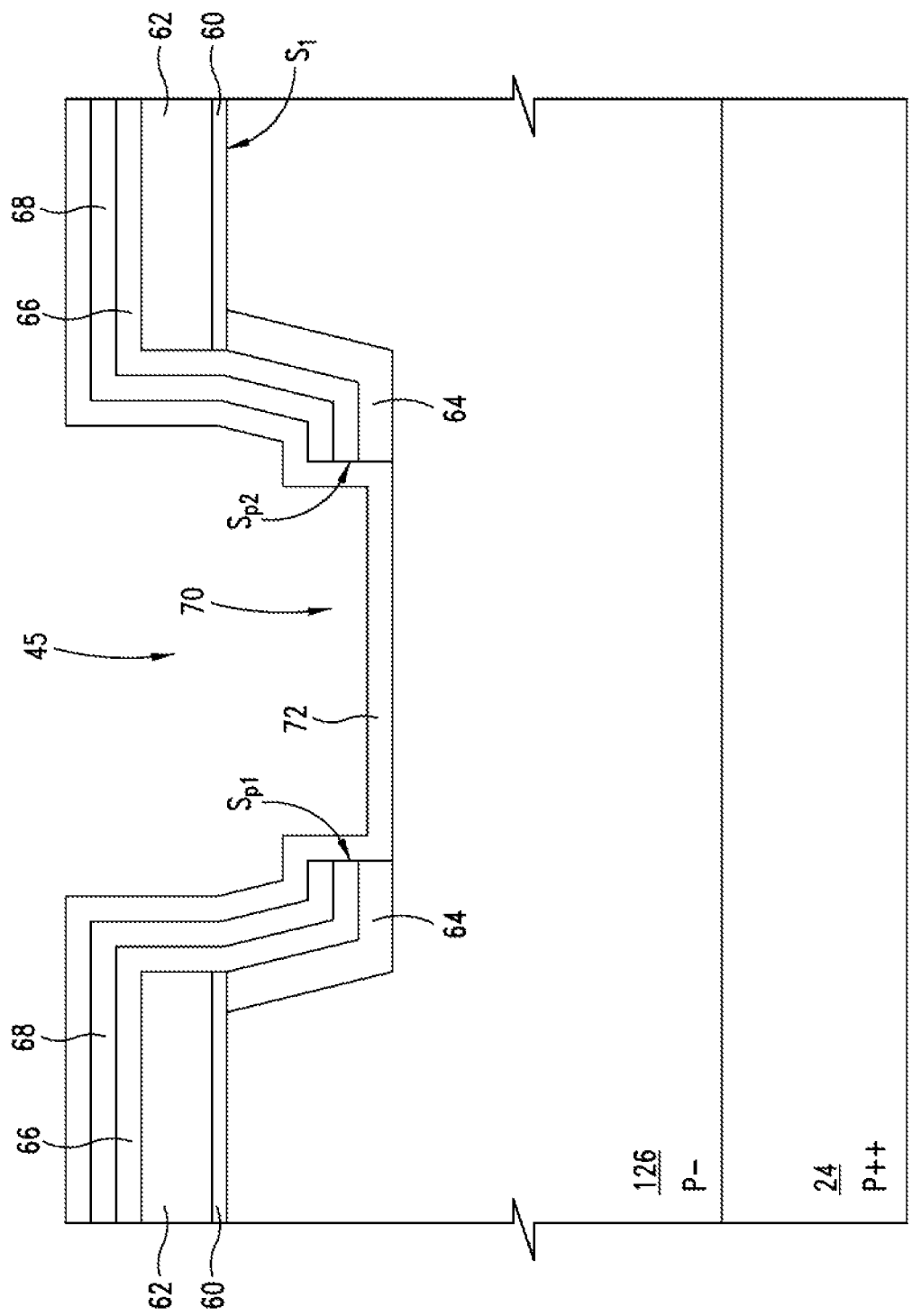

Next, as shown in FIG. 13, deposited on the device is a further dielectric layer 72, which will be referred to in what follows as the fifth dielectric process layer 72.

In detail, the fifth dielectric process layer 72 is made, for example, of silicon nitride, which is deposited above the fourth dielectric process layer 68, as well as within the first window 70. In greater detail, the fifth dielectric process layer 72 overlies the aforementioned first portion of the preliminary epitaxial region 126 and further coats the first and second side walls $S_{p1}$, $S_{p2}$ of the first window 70.

Figure 14:
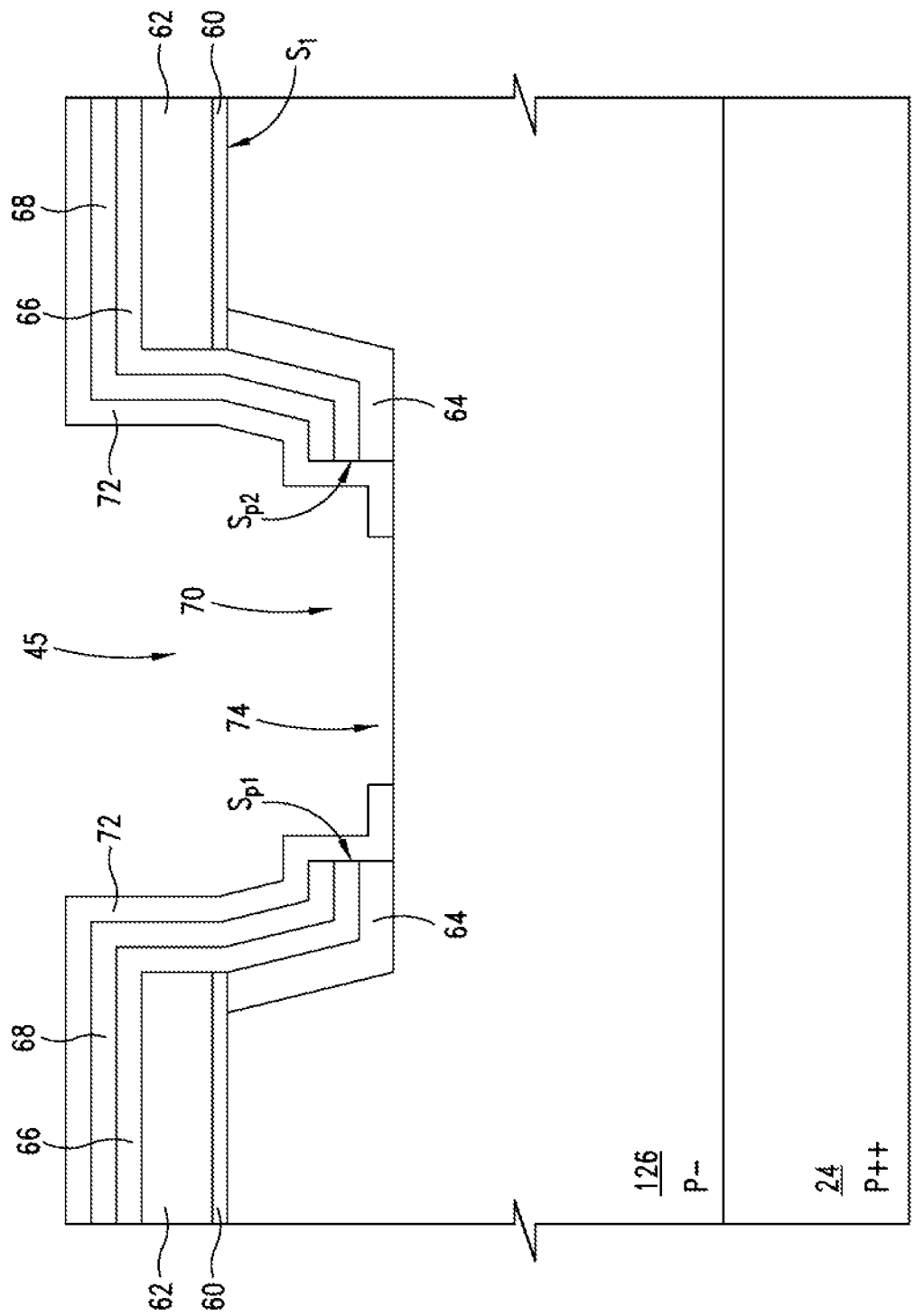

Next, as shown in FIG. 14, a further photolithographic process and a subsequent dry etch are carried out in order to remove selectively a portion of the fifth dielectric process layer 72 arranged on the bottom of the trench 45 and in direct contact with the preliminary epitaxial region 126. This selective removal entails formation of a second window 74 through the fifth dielectric process layer 72 and consequent exposure of a second portion of the preliminary epitaxial region 126, which is a subportion of the aforementioned first portion of the preliminary epitaxial region 126. However, this selective removal occurs for not exposing the first and second side walls $S_{p1}$, $S_{p2}$ of the first window 70.

Figure 15:
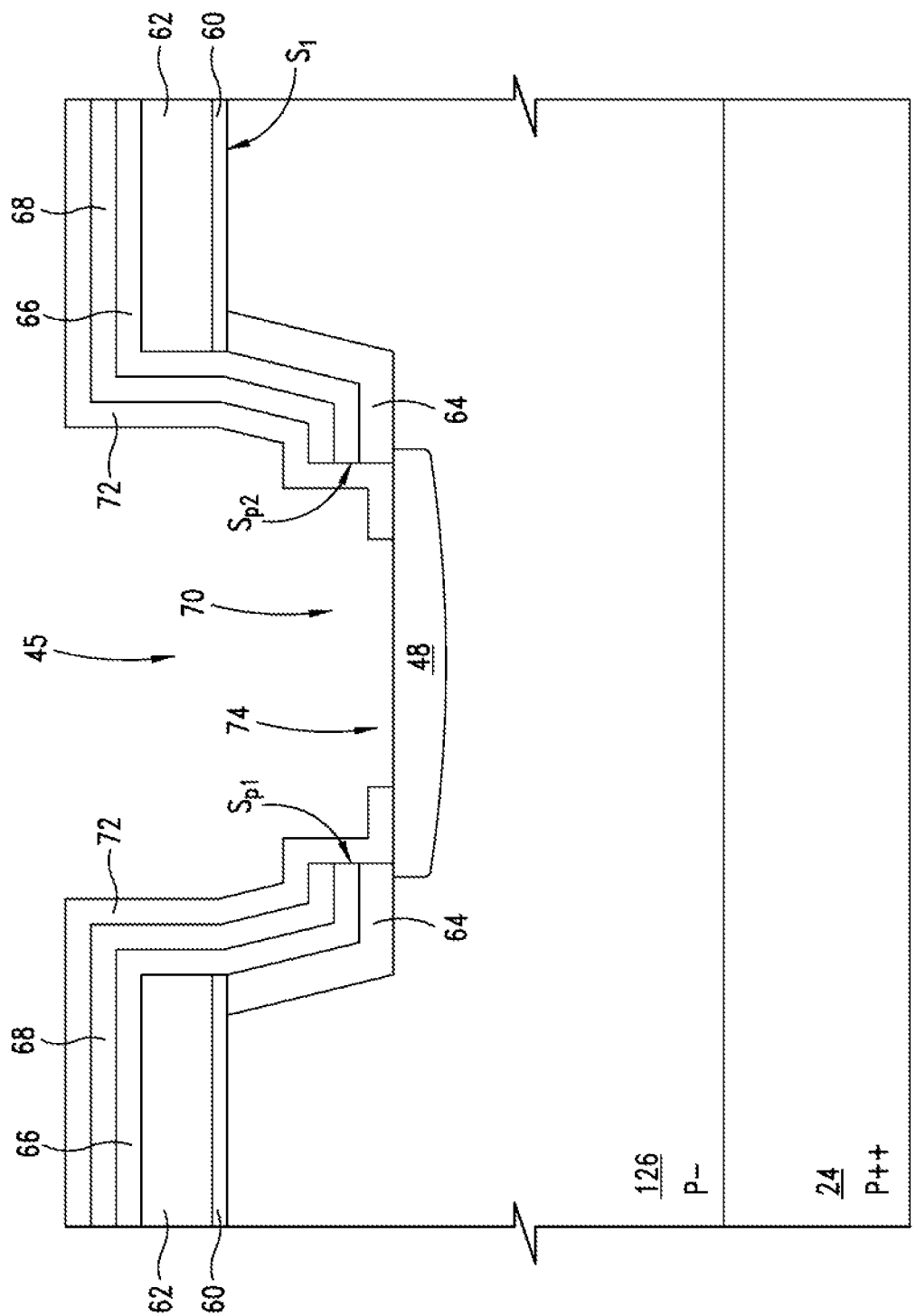

Next, as shown in FIG. 15, through the second window 74, an electrochemical etch is carried out (for example, with hydrofluoric acid, as well as by applying a current between the back of the wafer in which the die 22 is formed and the solution, which overlies the wafer) of the second portion of the preliminary epitaxial region 126, which is thus transformed into the nanostructured region 48. In FIG. 15, the nanostructured region 48 appears with a shape that is less schematic as compared to the representation of FIG. 5.

Without any loss of generality, the nanostructured region 48 extends so to project laterally with respect to the first and second side walls $S_{p1}$, $S_{p2}$ of the first window 70.

In even greater detail, during the electrochemical-etching process, the first and second side walls $S_{p1}$, $S_{p2}$ of the first window 70 are protected by corresponding portions of the fifth dielectric process layer 72. In particular, the remaining portions of the fourth dielectric process layer 68 and the fifth dielectric process layer 72 form a single silicon-nitride region, which protects the outer coating layer 64 and the third dielectric process layer 66 during the electrochemical-etching process, preventing erosion of said layers.

Figure 16:
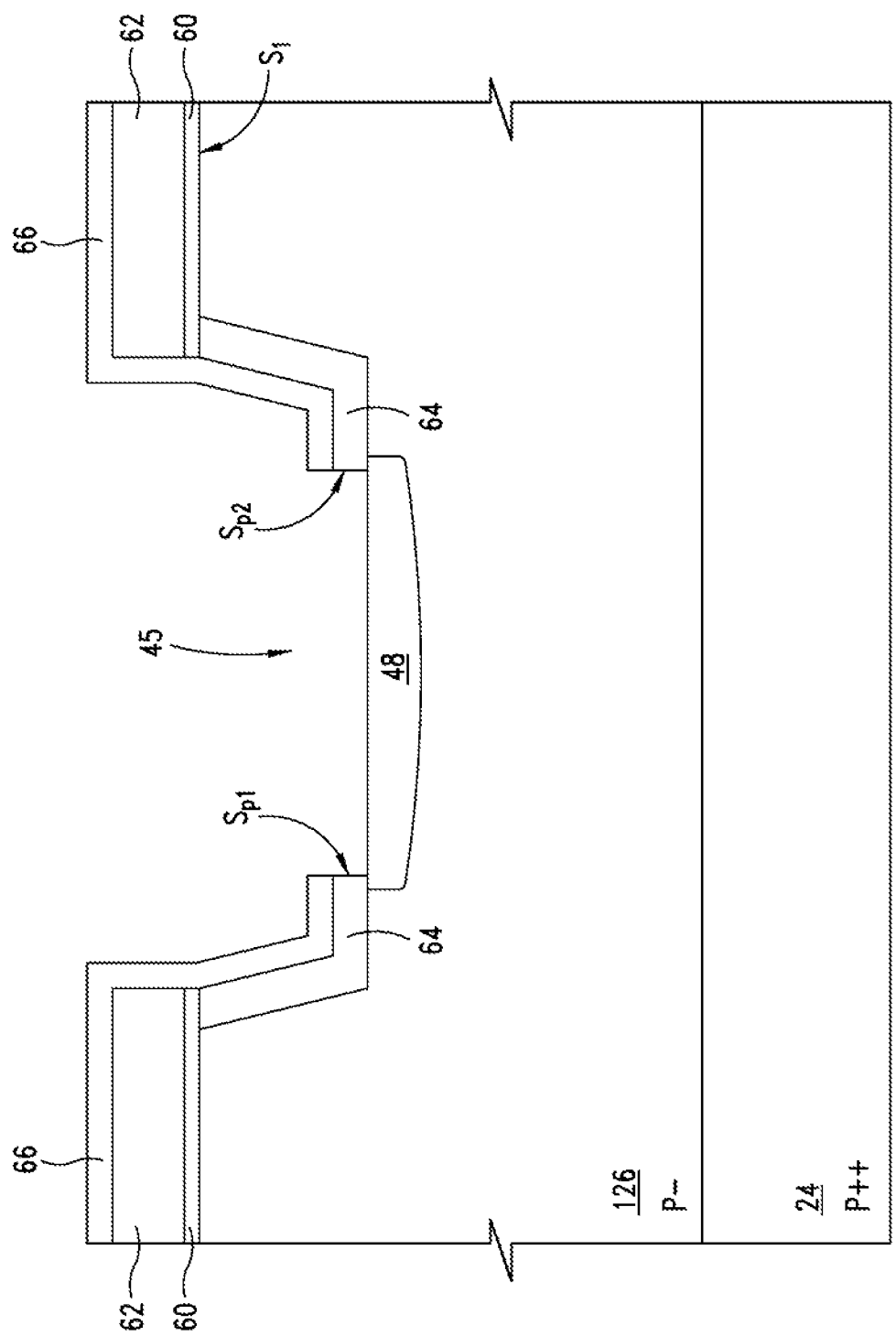

Next, as shown in FIG. 16, the remaining portions of the fourth dielectric process layer 68 and fifth dielectric process layer 72 are removed by a wet etch.

Figure 17:
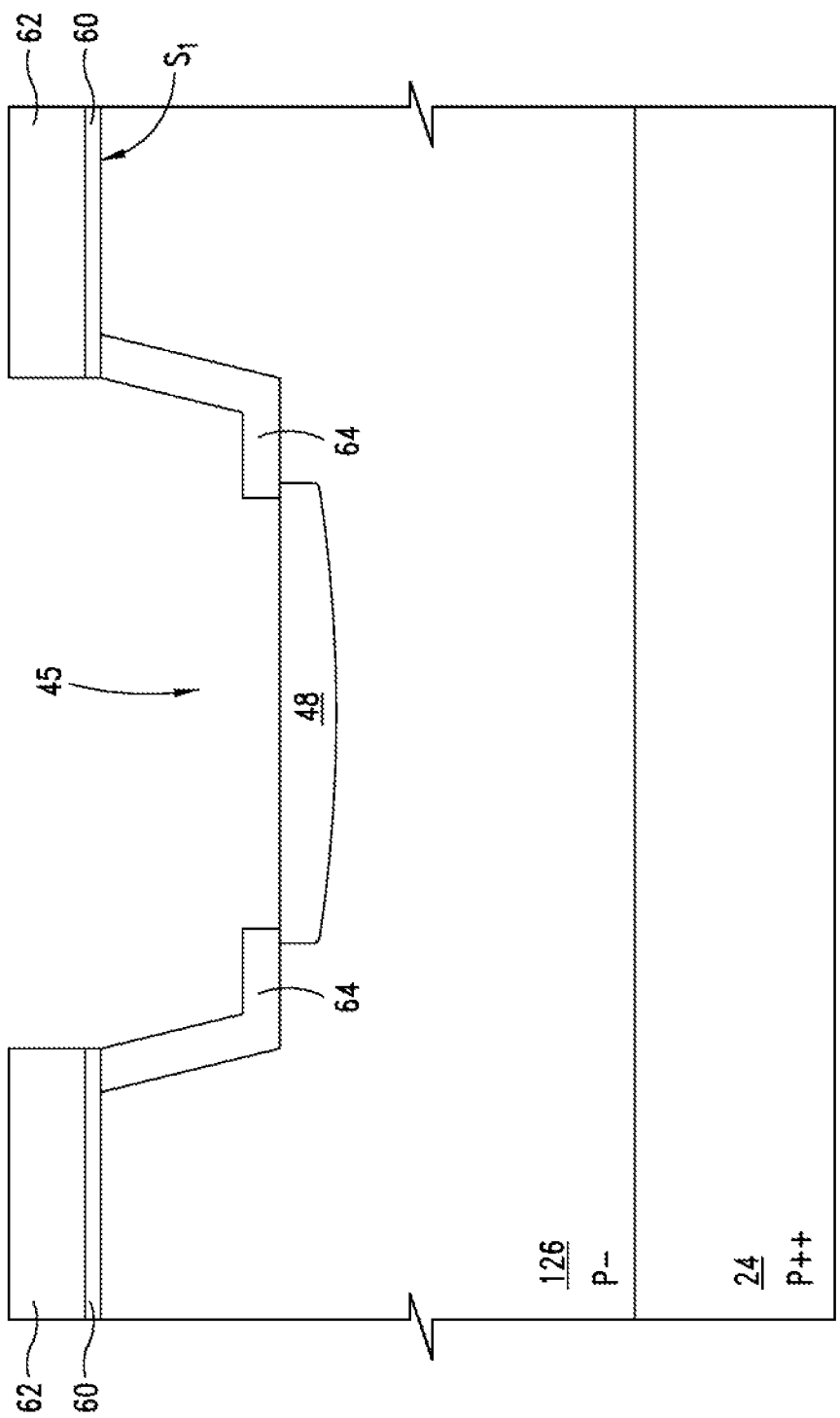

Then, as shown in FIG. 17, the remaining portions of the third dielectric process layer 66 are removed by a wet etch.

Figure 18:
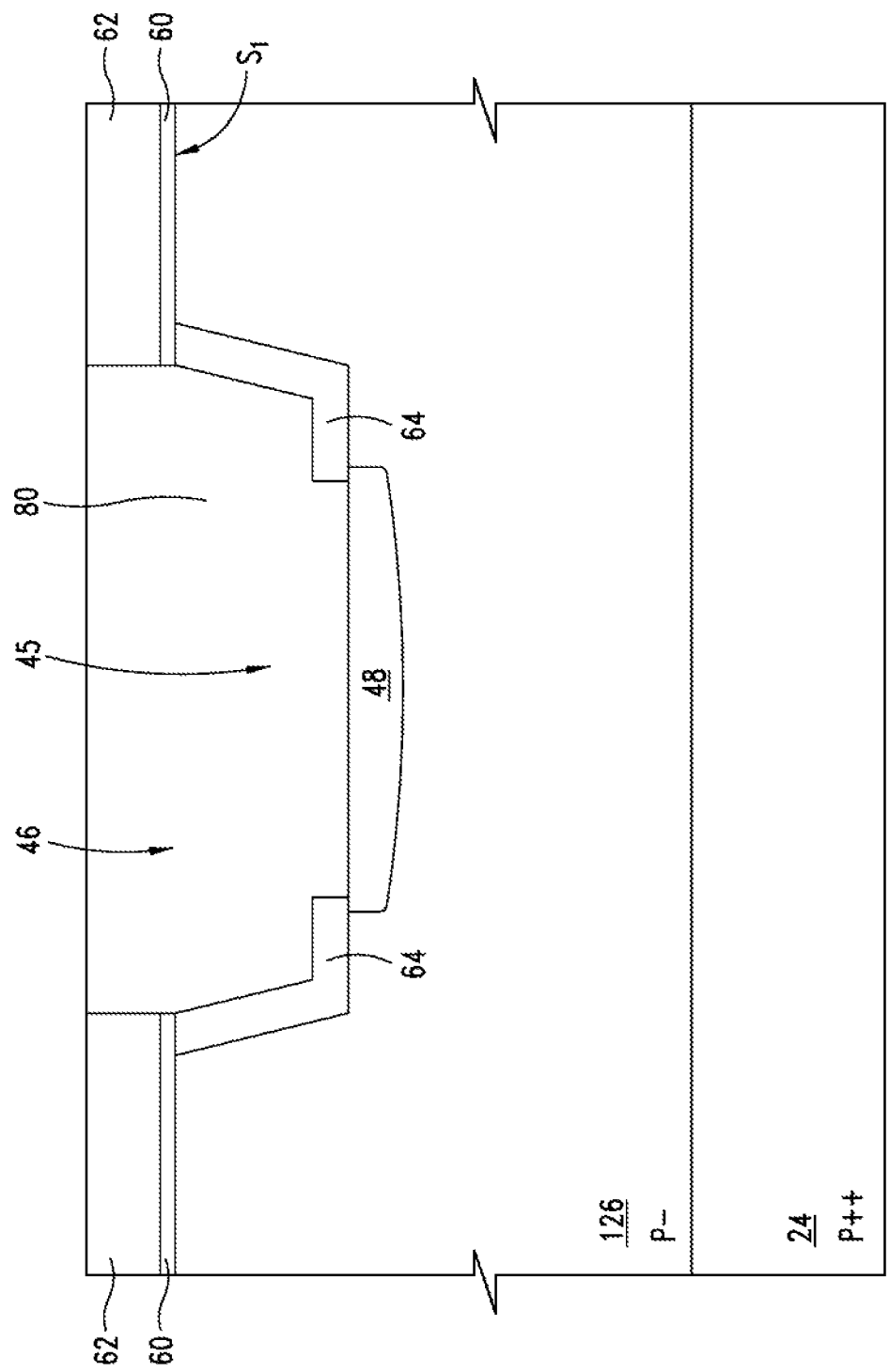

Next, as shown in FIG. 18, and in a per se known manner in the field of STI technology, formed within the trench 45, by deposition, is a dielectric region 80, which will be referred to in what follows as the preliminary dielectric region 80. For instance, the preliminary dielectric region 80 may be formed via so-called high-density plasma (HDP) deposition.

In detail, the preliminary dielectric region 80 is made, for example, of TEOS oxide and extends so to fill completely the trench 45, together with the portions of the internal coating layer 64 that have remained after the operations described with reference to FIG. 12. Further, the preliminary dielectric region 80 contacts the remaining portions of the internal coating layer 64 and the nanostructured region 48.

In greater detail, FIG. 18 shows the preliminary dielectric region 80 after operations of thermal densification and chemical-mechanical polishing (CMP) have been carried out, in a per se known manner.

Figure 19:
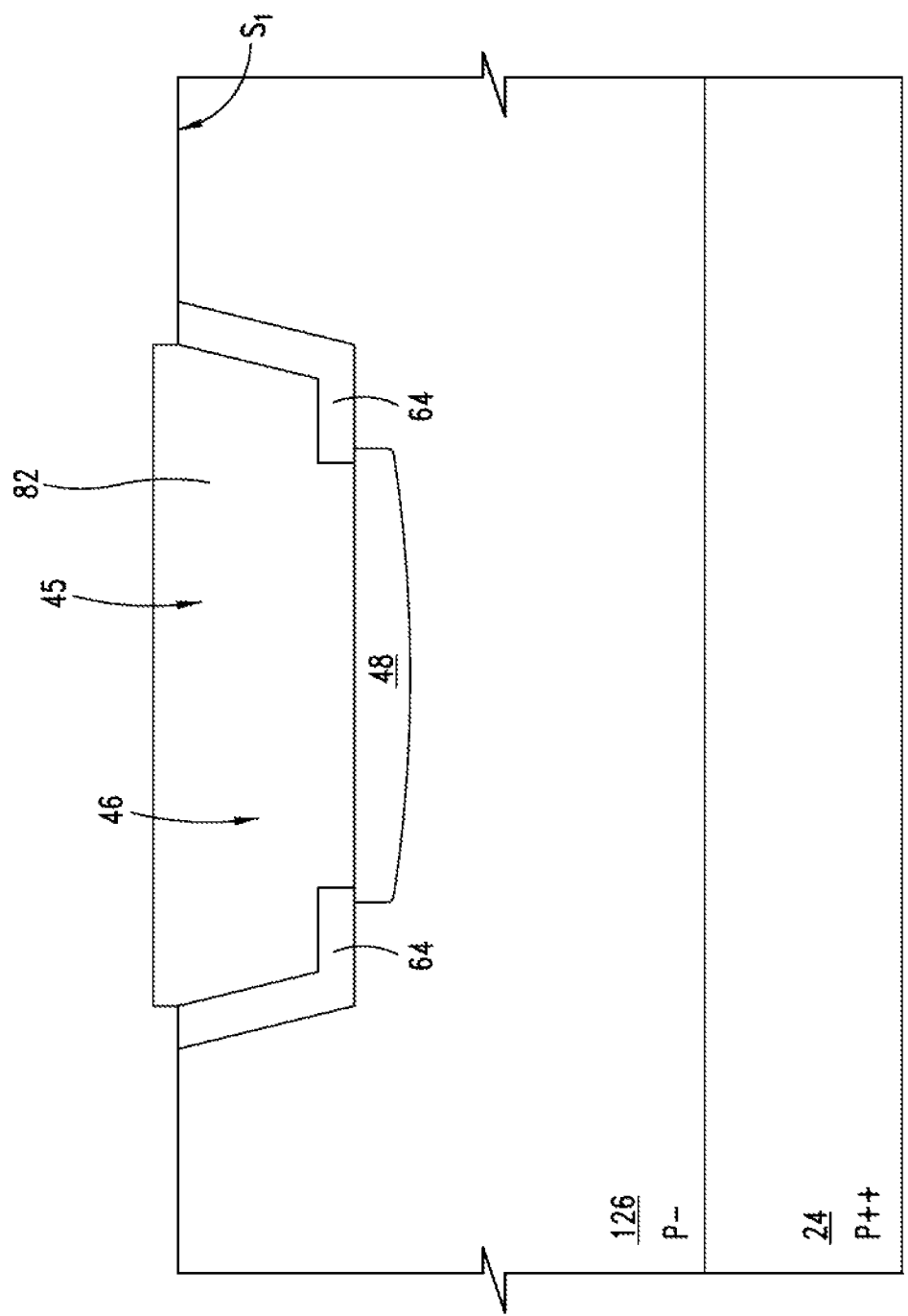

Next, as shown in FIG. 19, the remaining portions of the first and second dielectric process layers 60, 62 are removed by a wet etch for exposing again portions of the preliminary epitaxial region 126 arranged laterally with respect to the trench 45. Further, this etch entails removal of a top portion of the preliminary dielectric region 80. The remaining portion of the preliminary dielectric region 80 forms an inner dielectric region 82.

In practice, the inner dielectric region 82 forms, together with the portions that have remained of the internal coating layer 64, the insulation region 46. The composition of the insulation region 46 was not mentioned before, in FIG. 5 and in the corresponding description, for reasons of simplicity.

Figure 20:
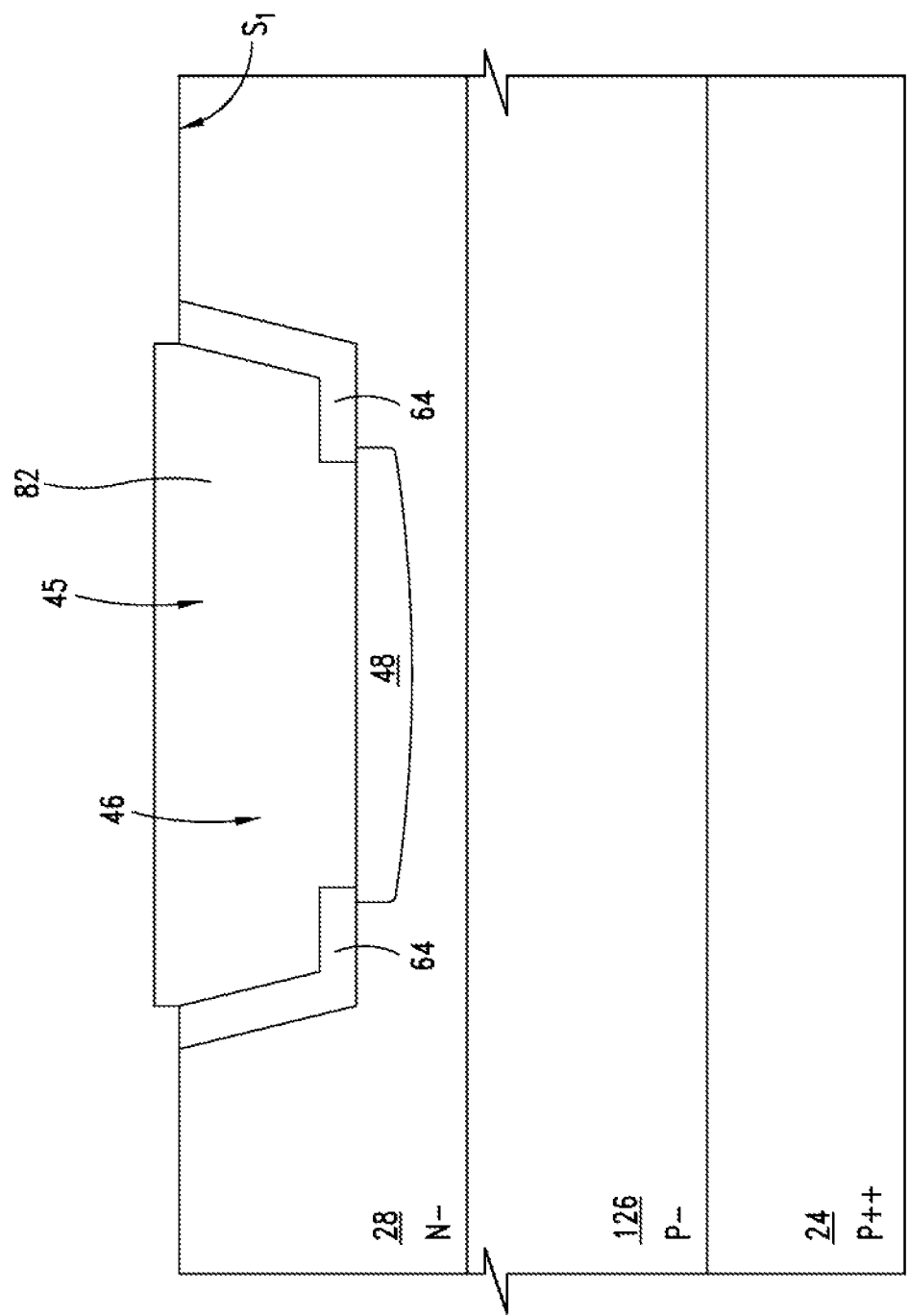

Next, as shown in FIG. 20, an implantation of dopant species of an N type (for example, phosphorus ions) is carried out, followed by a thermal treatment, so that a top portion of the preliminary epitaxial region 126 forms the implanted layer 28. The implanted layer 28 extends starting from the first surface $S_1$, to a depth greater than the depth of the nanostructured region 48 so that the latter is surrounded laterally and at the bottom by the implanted layer 28. The non-implanted portion of the preliminary epitaxial region 126 forms the epitaxial layer 26.

In a per se known manner and thus not shown, there are subsequently formed, among other things, the well 34, the drain region 38, the body region 32, the source region 36, and the body contact region 40, for example by implantation processes.

Figure 21:
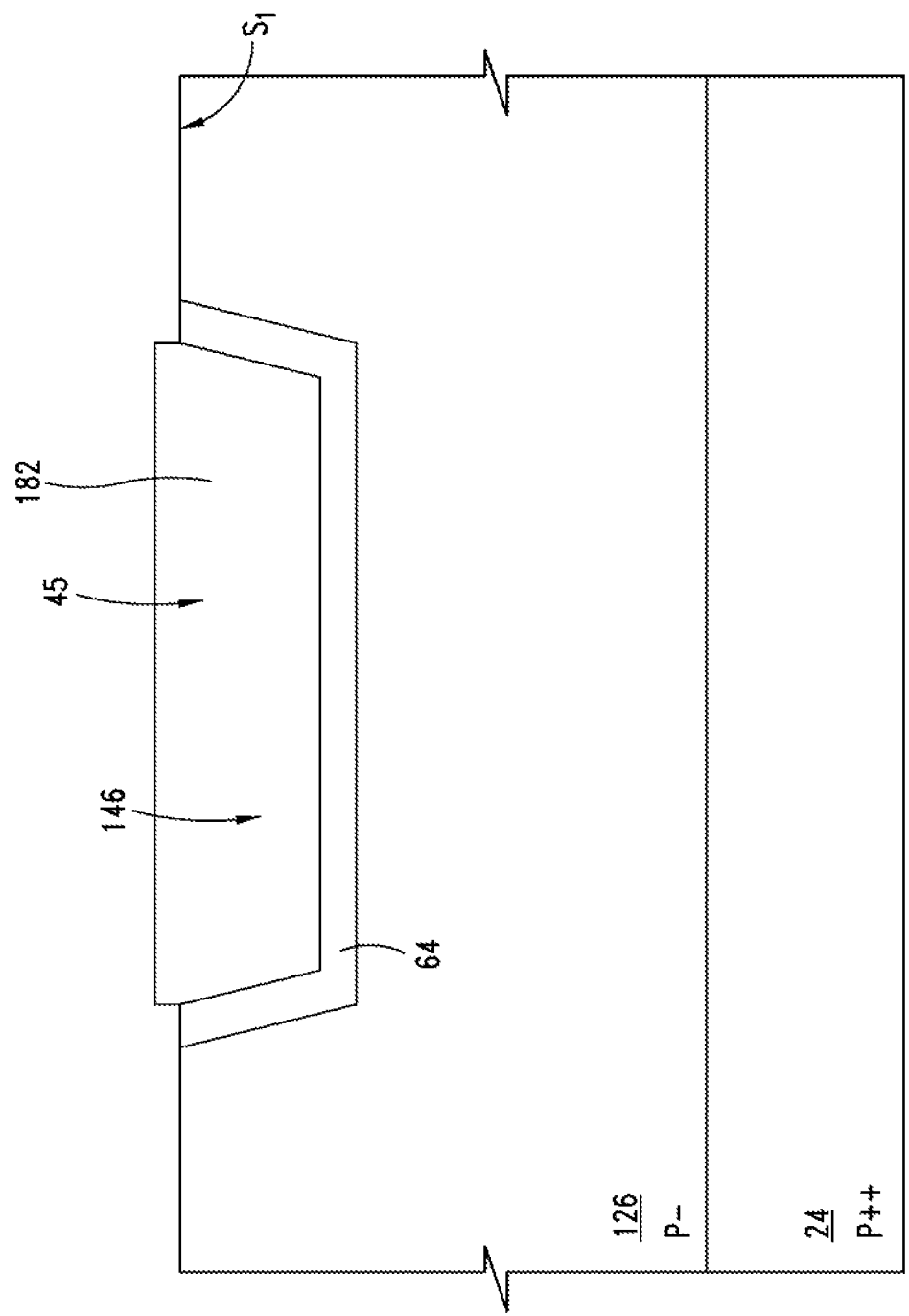

As shown in FIG. 21, it is further possible to adopt a different manufacturing process, which envisages, initially, formation of the preliminary epitaxial region 126 on the substrate 24. Further, formed in the preliminary epitaxial region 126 is, in a per se known manner, a preliminary insulation region 146, comprising the outer coating layer 64, which is of thermal oxide and coats both the side walls and the bottom of the trench 45, and a preliminary inner dielectric region 182, which is of deposited oxide and is surrounded laterally and at the bottom by the outer coating layer 64.

Figure 22:
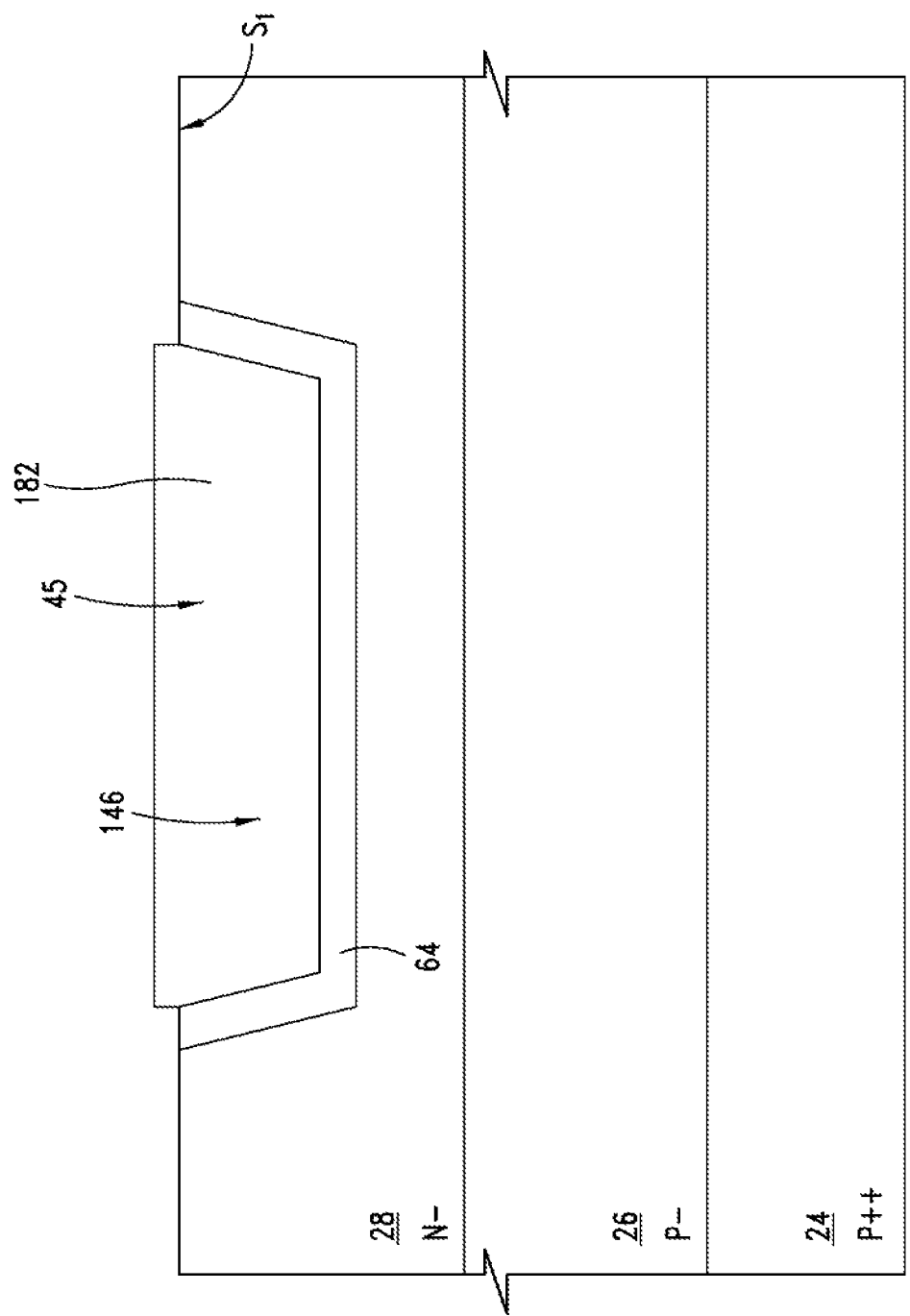

Then, as shown in FIG. 22, an implantation of dopant species of an N type (for example, phosphorus ions) is carried out, followed by thermal annealing, so that a top portion of the preliminary epitaxial region 126 forms the implanted layer 28. The implanted layer 28 extends starting from the top surface $S_1$, to a depth greater than the depth of the preliminary insulation region 146. The non-implanted portion of the preliminary epitaxial region 126 forms the epitaxial layer 26.

Figure 23:
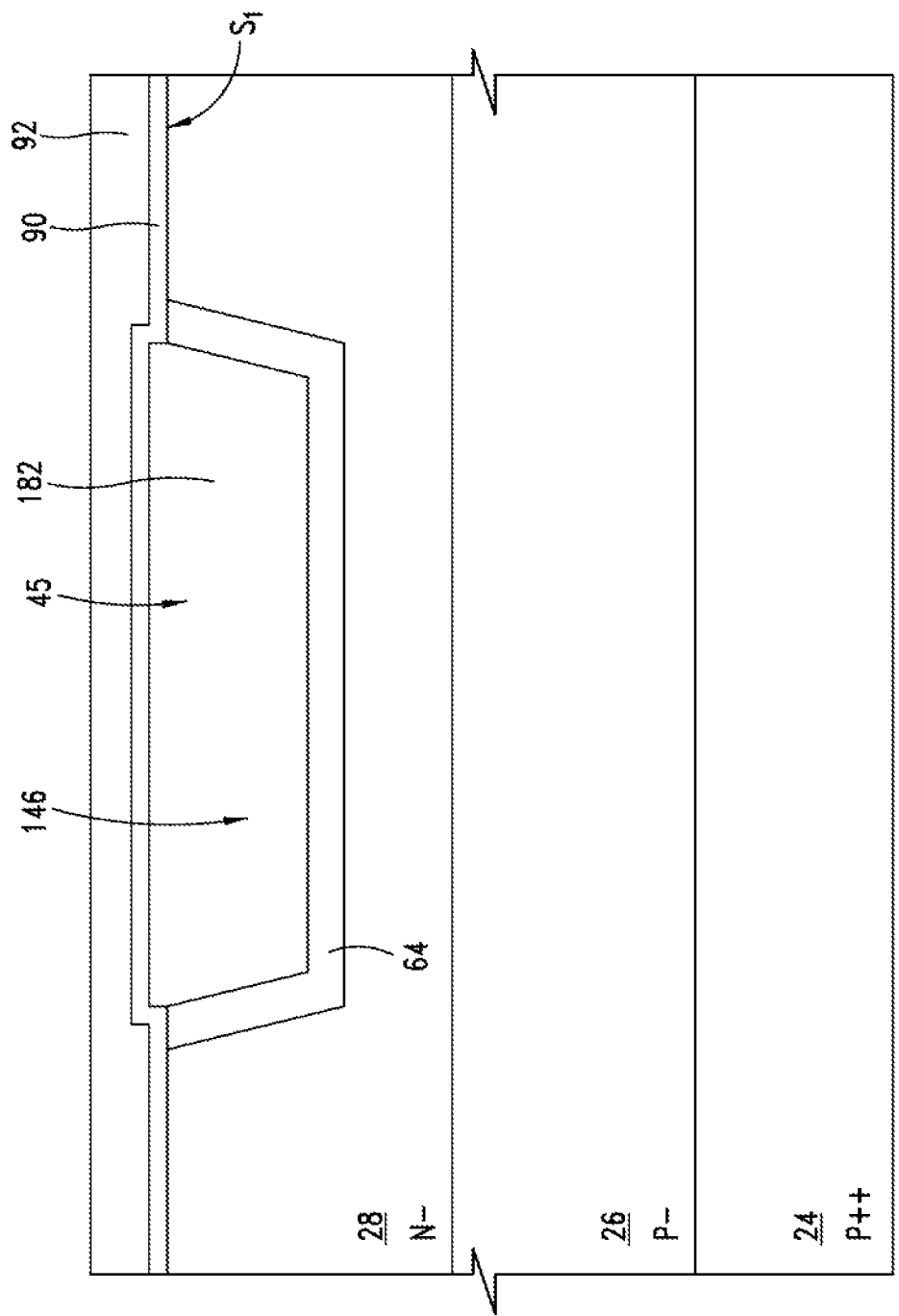

Next, as shown in FIG. 23, formed by deposition on the top surface $S_1$ and on the preliminary insulation region 146 (in particular, on the preliminary inner dielectric region 182) is a dielectric layer 90, which will be referred to in what follows as the sixth dielectric process layer 90. For instance, the sixth dielectric process layer 90 is of TEOS oxide. Further, deposited on the sixth dielectric process layer 90 is a further dielectric layer, which will be referred to in what follows as the seventh dielectric process layer 92. The seventh dielectric process layer 92 is made, for example, of silicon nitride. For simplicity of representation, in FIG. 23 the seventh dielectric layer 92 is shown as delimited at the top by a plane surface, even though in actual fact it is conformal.

Figure 24:
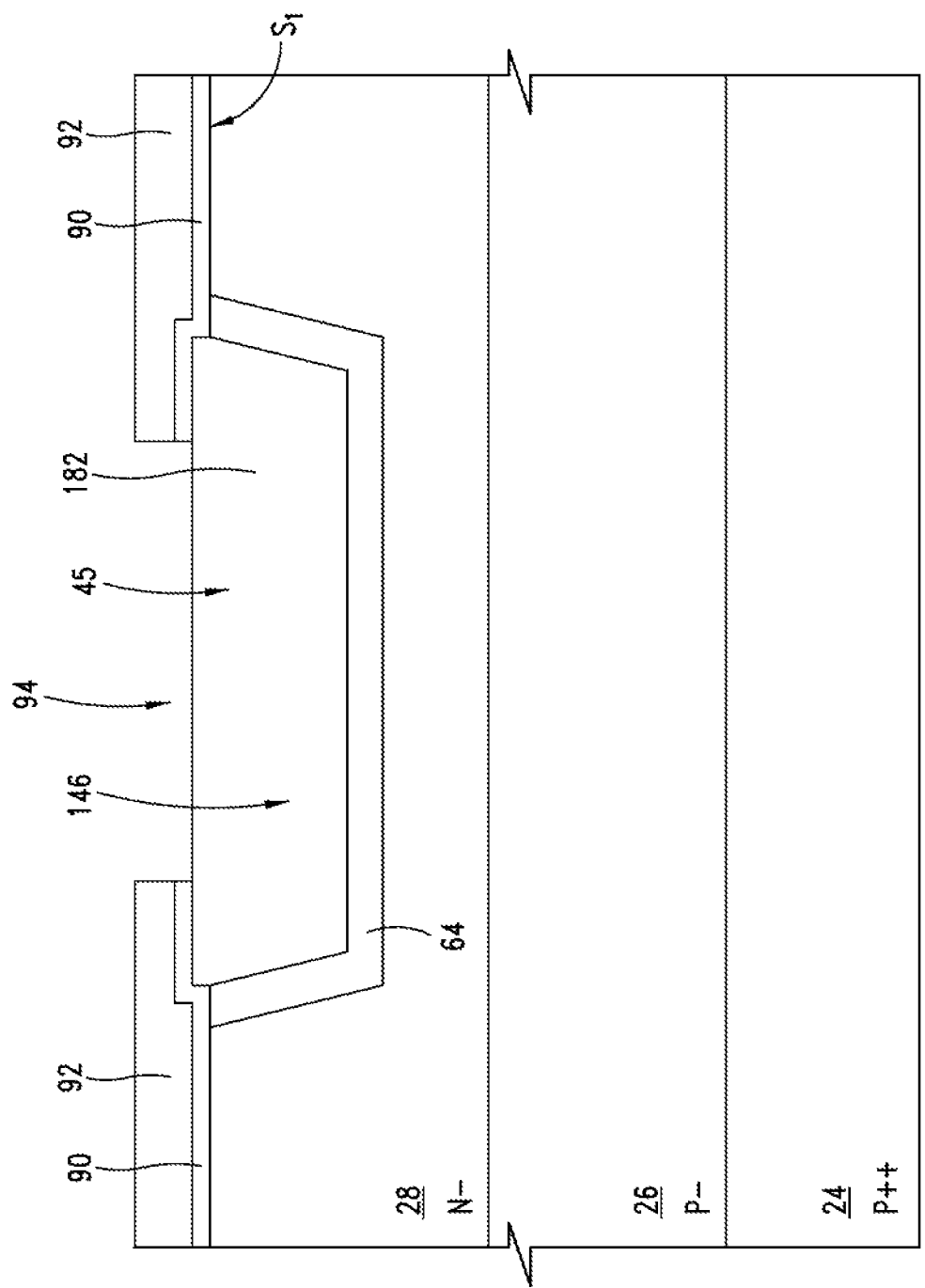

Next, as shown in FIG. 24, a photolithographic process and a subsequent double dry chemical etch are carried out in order to remove selectively a portion of the seventh dielectric process layer 92, which overlies at a distance the bottom of the trench 45, and an underlying portion of the sixth dielectric process layer 90. In practice, these operations lead to formation of a third window 94, which overlies, at a distance, the bottom of the trench 45, and enables a portion of the preliminary inner dielectric region 182 to be exposed.

Figure 25:
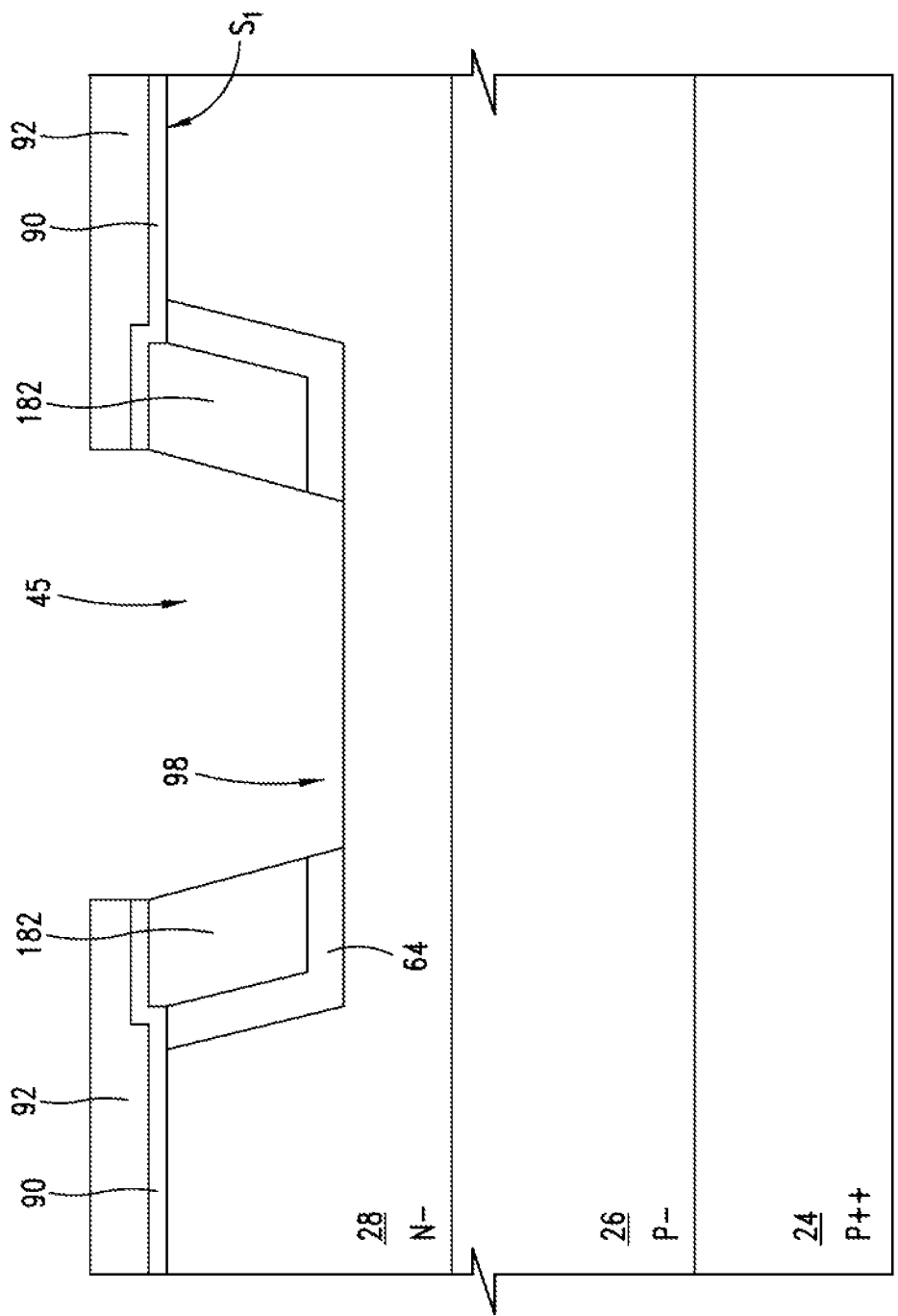

Then, as shown in FIG. 25, a further dry chemical etch is carried out, during which the remaining portions of the sixth and seventh dielectric process layers 90, 92 function as so-called hard mask. This further dry chemical etch causes selective removal of a portion of the preliminary inner dielectric region 182 that extends to the third window 94, as well as of an underlying portion of the outer coating layer 64, which coats the bottom of the trench 45. Consequently, the remaining portions of the outer coating layer 64, of the preliminary inner dielectric region 182, and of the sixth and seventh dielectric process layers 90, 92 form a fourth window 98 that extends to a portion of the implanted layer 28 arranged in contact with the bottom of the trench 45.

Figure 26:
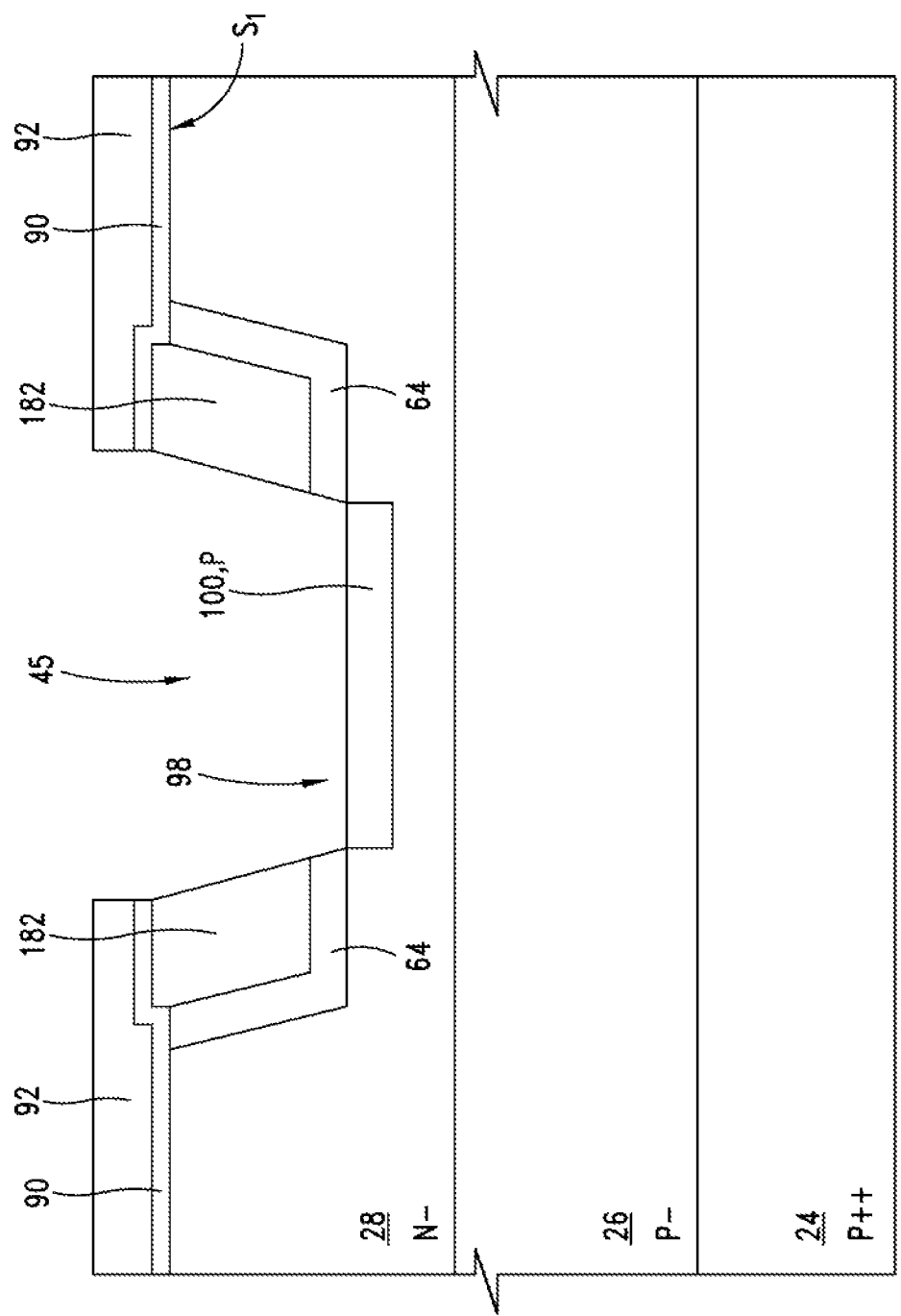

Next, as shown in FIG. 26, through the fourth window 98 a selective implantation of dopant species of a P type (for example, boron ions) is carried out, followed by thermal annealing, so that the portion of the implanted layer 28 that extends to the fourth window 98 is transformed into a corresponding region 100 of a P type, which will be referred to in what follows as the intermediate region 100.

Figure 27:
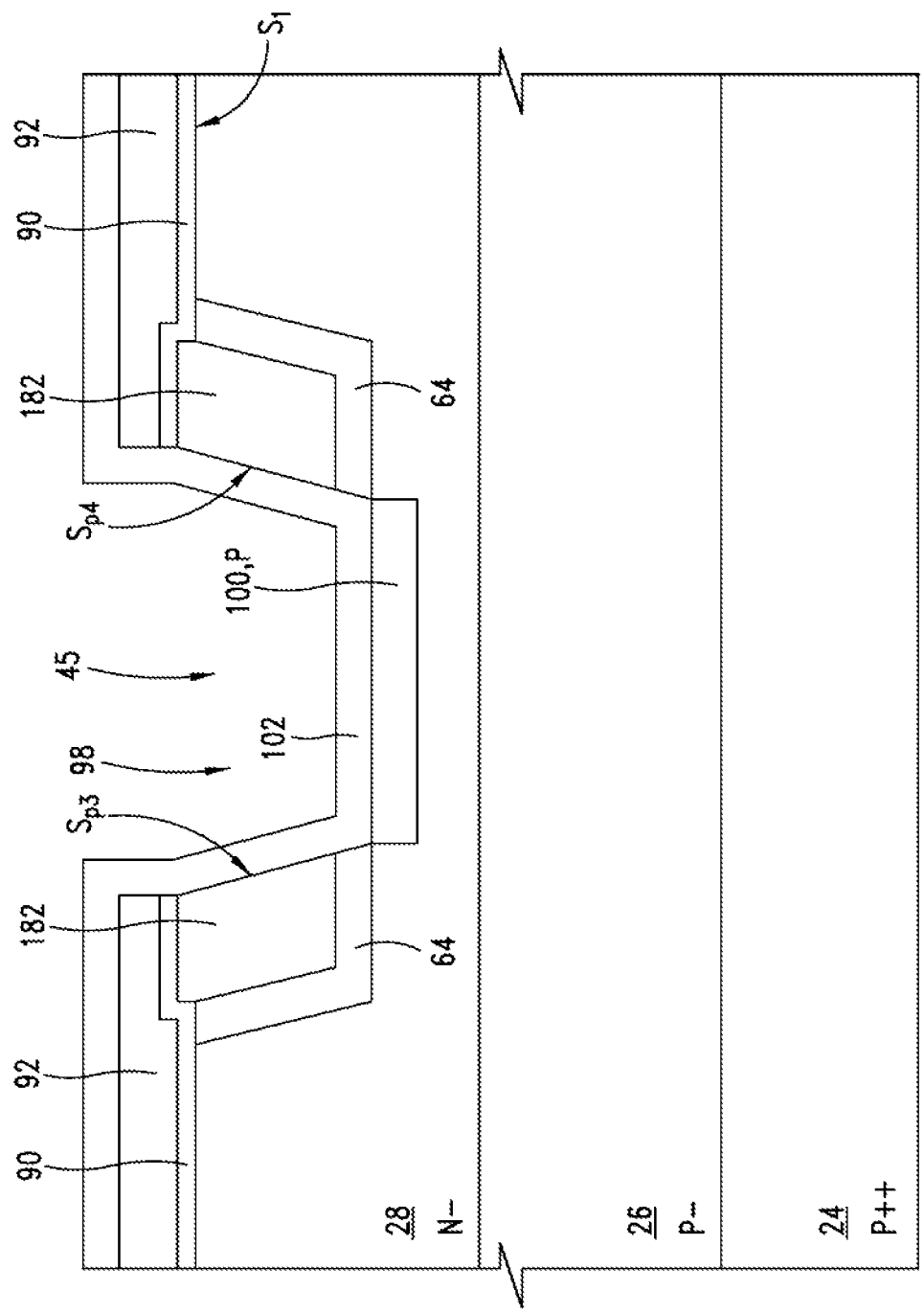

Next, as shown in FIG. 27, a further dielectric layer 102 is deposited, which will be referred to in what follows as the eighth dielectric process layer 102.

In detail, the eighth dielectric process layer 102 is made, for example, of silicon nitride and overlies the seventh dielectric process layer 92 and the intermediate region 100. Further, the eighth dielectric layer 102 coats the exposed portions of the seventh dielectric process layer 90, of the preliminary inner dielectric region 182, and of the outer coating layer 64. In particular, the eighth dielectric process layer 102 coats the portions of the preliminary inner dielectric region 182 and of the outer coating layer 64 that delimit the fourth window 98 laterally, forming the first and second side walls of the latter (these walls being designated, respectively, by $S_{pa}$ and $S_{p4}$).

Figure 28:
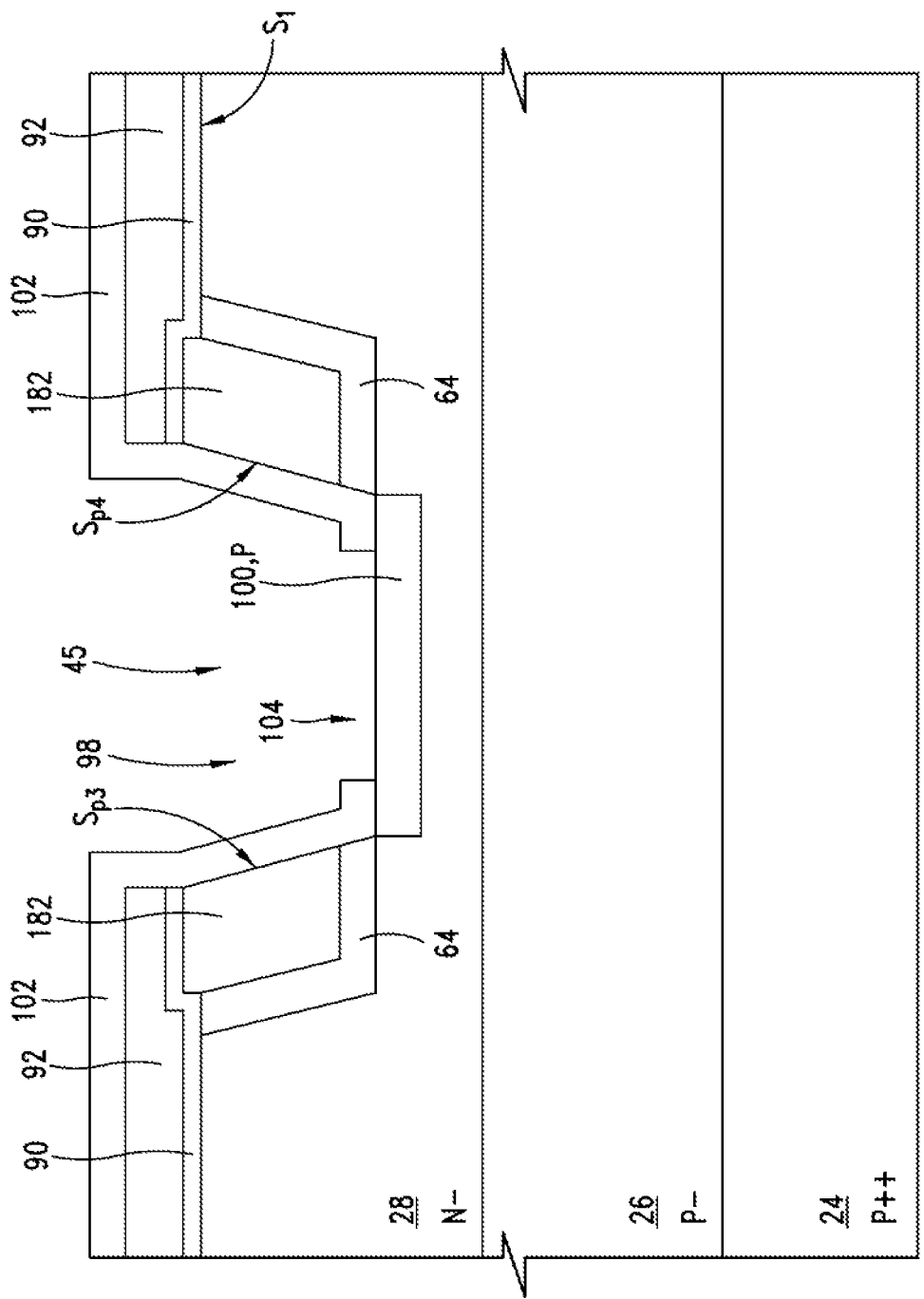

Next, as shown in FIG. 28, a further photolithographic process and a subsequent dry etch are carried out in order to remove selectively a portion of the eighth dielectric process layer 102 that overlies the intermediate region 100. In this way, the residual portions of the eighth dielectric process layer 102 form a fifth window 104, which extends to a portion of the intermediate region 100, which is thus exposed. Selective removal of the aforementioned portion of the eighth dielectric layer 102 occurs so as not to expose the first and second side walls $S_{p3}$, $S_{p4}$ of the fourth window 98.

Figure 29:
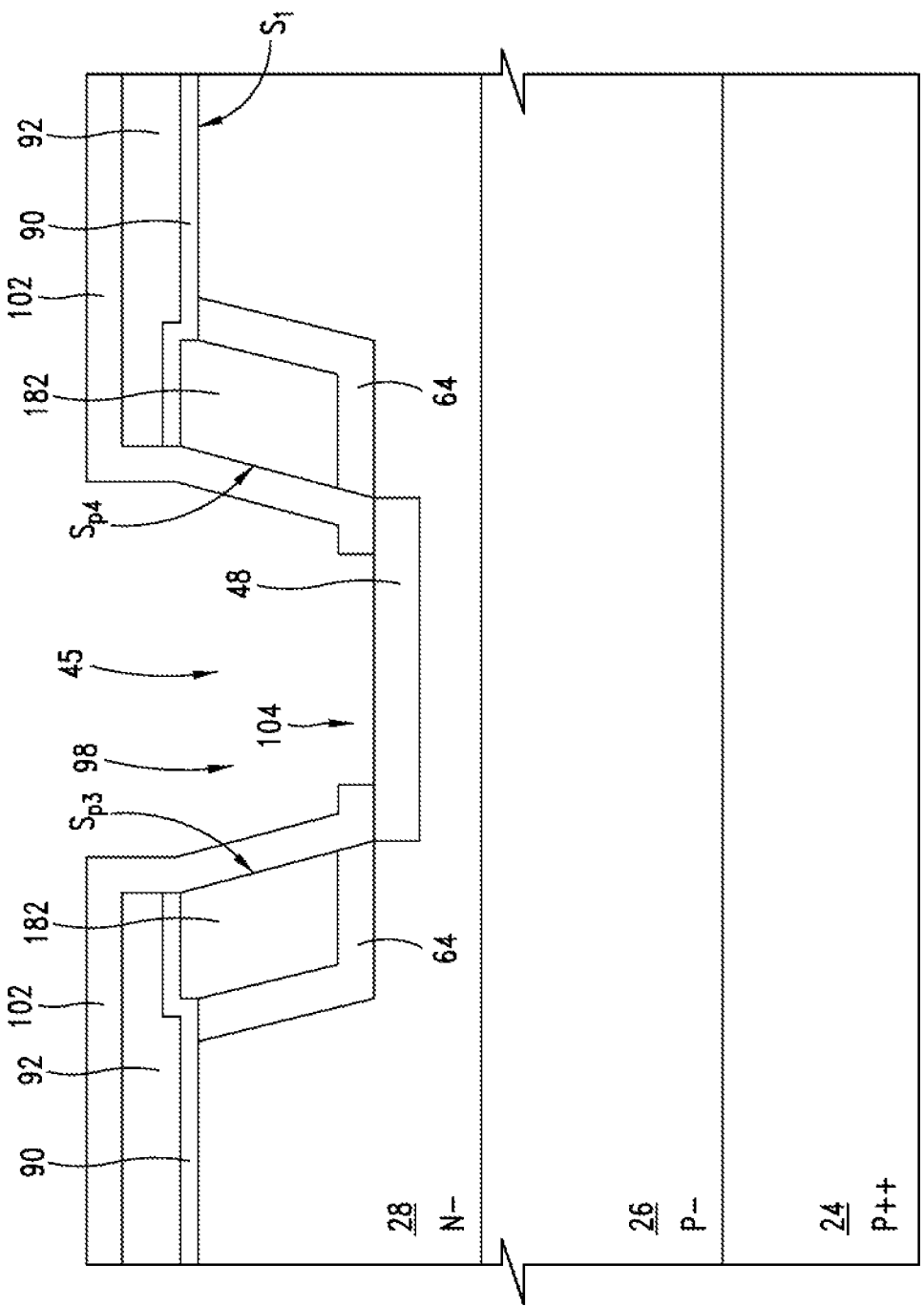

As shown in FIG. 29, through the fifth window 104, an electrochemical etch is then carried out (for example, using hydrofluoric acid, as well as by applying a current between the back of the wafer in which the die 22 is formed and the solution, which overlies the wafer) of the intermediate region 100, which is thus transformed into the nanostructured region 48, which, without any loss of generality, projects laterally with respect to the side walls of the fifth window 104.

In greater detail, during the electrochemical-etching process, the first and second side walls $S_{p3}$, $S_{p4}$ of the fourth window 98 are protected by corresponding portions of the eighth dielectric process layer 102, which, as mentioned, are made, for example, of silicon nitride. This protection prevents the remaining portions of the preliminary inner dielectric region 182 and of the outer coating layer 64 from being eroded during the electrochemical-etching process.

In addition, the fact that the intermediate region 100 is of a P type enables generation of the nanostructured region 48 by an electrochemical-etching process, without having to resort to appropriate conditions of lighting, as would occur, instead, if the intermediate region 100 were of an N type. Further, thanks to the fact that the intermediate region 100 is delimited at the bottom by the implanted layer 28, the latter represents a so-called endpoint for the electrochemical-etching process.

Figure 30:
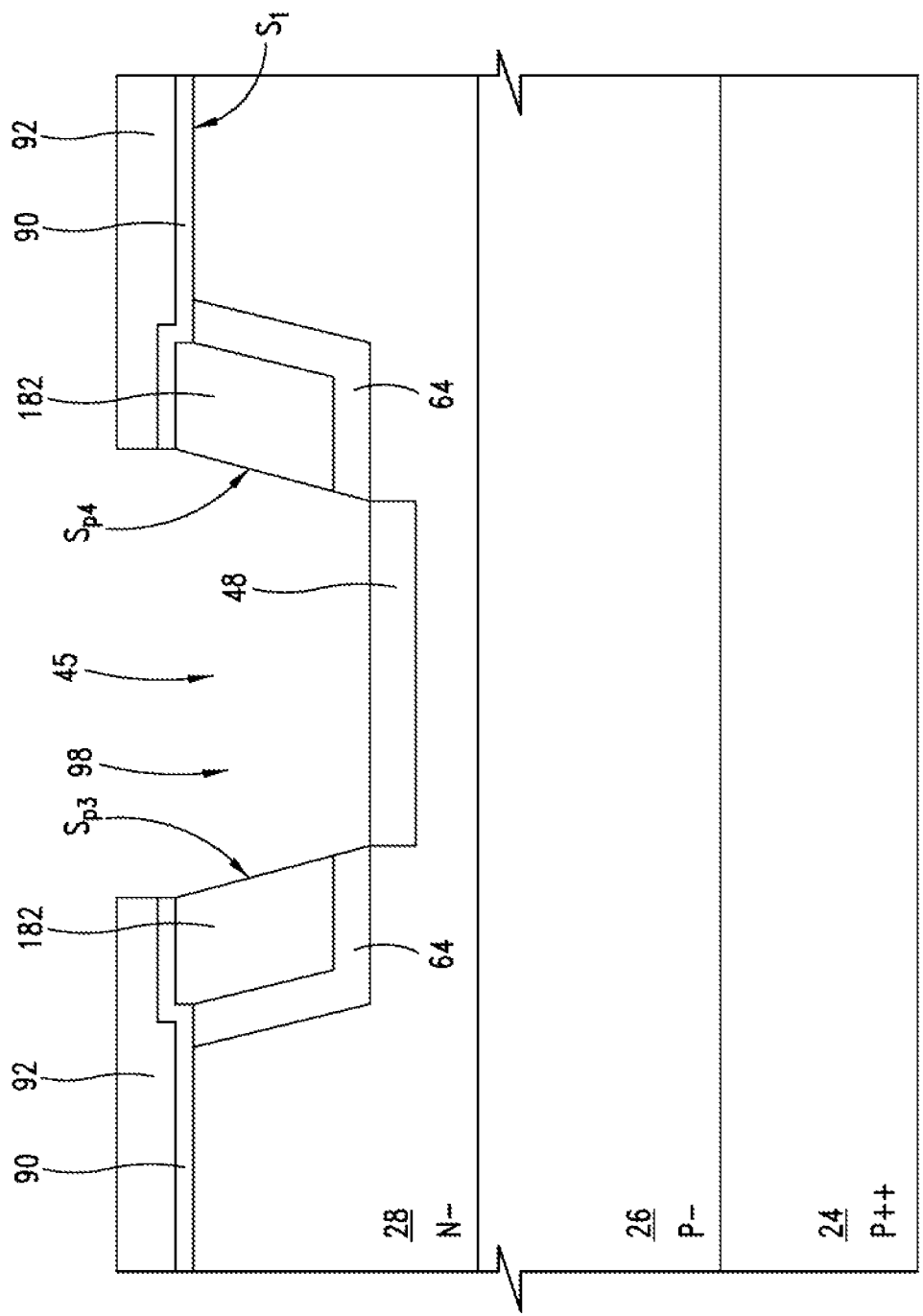

Next, as shown in FIG. 30, the residual portions of the eighth dielectric process layer 102 are removed by a wet etch.

Figure 31:
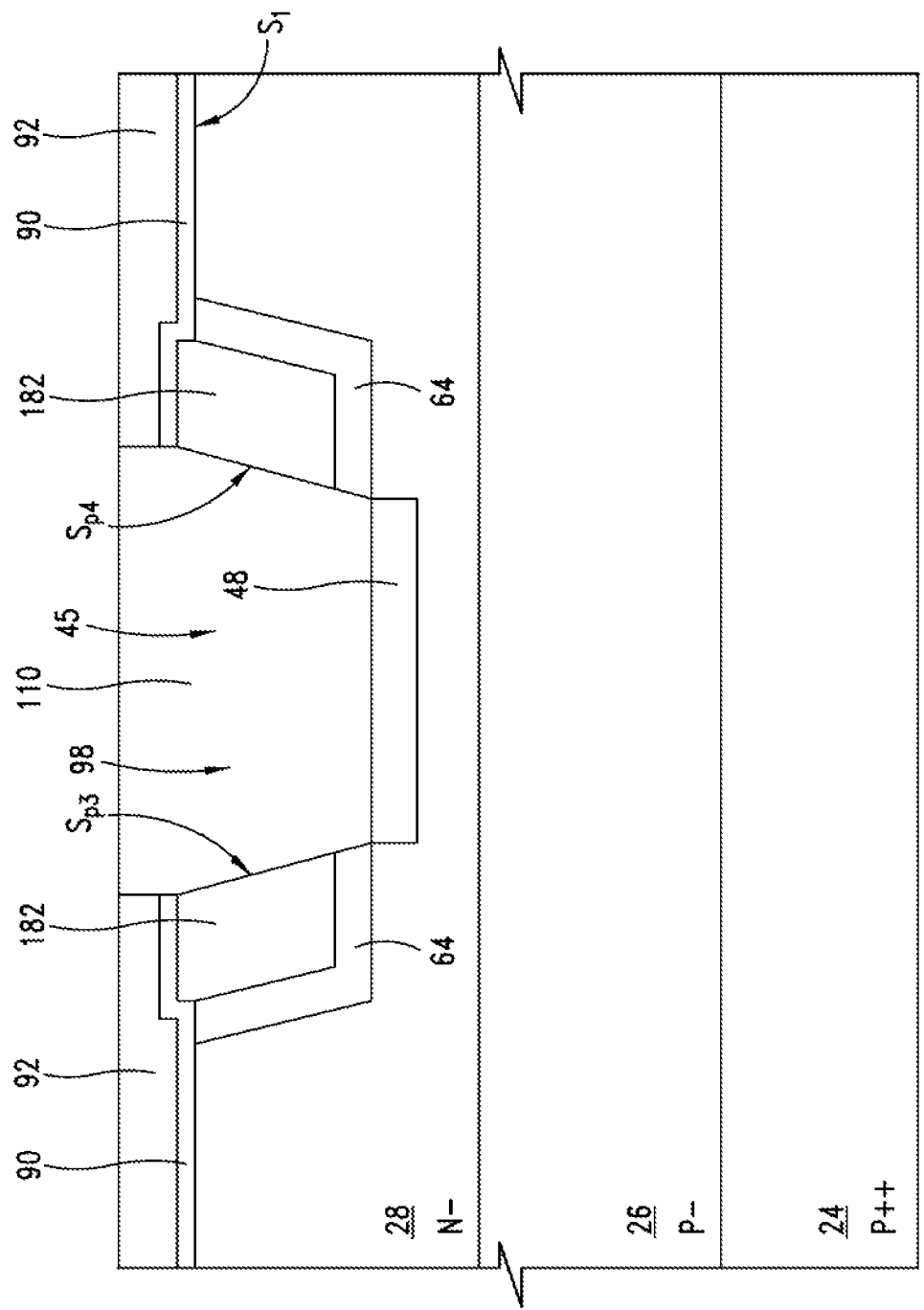

Then, as shown in FIG. 31, the fourth window 98 is filled with a filling region 110, which is made, for example, of TEOS oxide deposited by high-density plasma deposition. In particular, in FIG. 31 the filling region 110 is shown after operations of thermal densification and mechanical polishing have been carried out, in a per se known manner.

Figure 32:
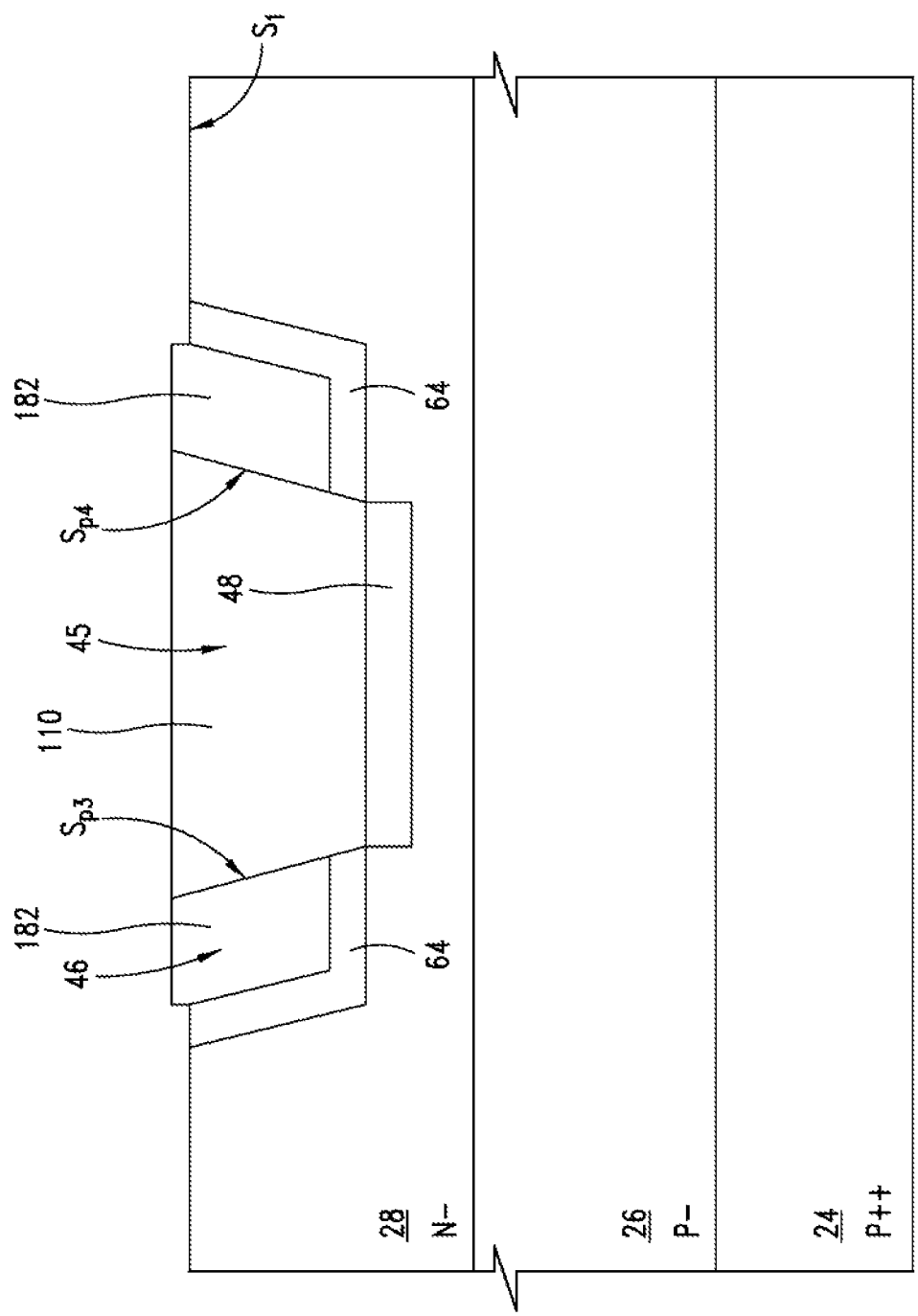

Next, as shown in FIG. 32, the remaining portions of the sixth and seventh dielectric process layers 90, 92 and a top portion of the filling region 110 are removed by two wet etches. The residual portion of the filling region 110 forms, together with the residual portions of the preliminary inner dielectric region 182, the insulation region 46.

Then, the manufacturing process continues as described previously.

From what has been described and illustrated previously, the advantages that the present solution affords emerge clearly.

In particular, the present integrated electronic device includes at least one diode, which, starting from a condition in which it operates in forward biasing, may be switched off in short times, since it minimizes the charge stored during the conduction step. Further, the present electronic device may be implemented with a technology of a so-called BCD type; i.e., it does not require steps additional to those of a traditional BCD process.

Finally, it is clear that modifications and variations may be made to what has been described and illustrated so far, without thereby departing from the scope of the present disclosure.

For instance, the well 34 may be absent.

As mentioned previously, the hard mask may contain layers of materials different from silicon nitride, such as for example oxides.

In addition, the third dielectric process layer 66 may be absent, in which case the fourth dielectric process layer 68 is formed on the outer coating layer 64, as well as on portions of the second dielectric process layer 62.

The types of doping may be reversed with respect to what has been described.

Finally, it is possible to change the order in which the steps of the manufacturing process are carried out. It is, for example, possible for the well 34 and/or the body region 34 to be formed before the nanostructured region 48 and the insulation region 46.

Figure 1:
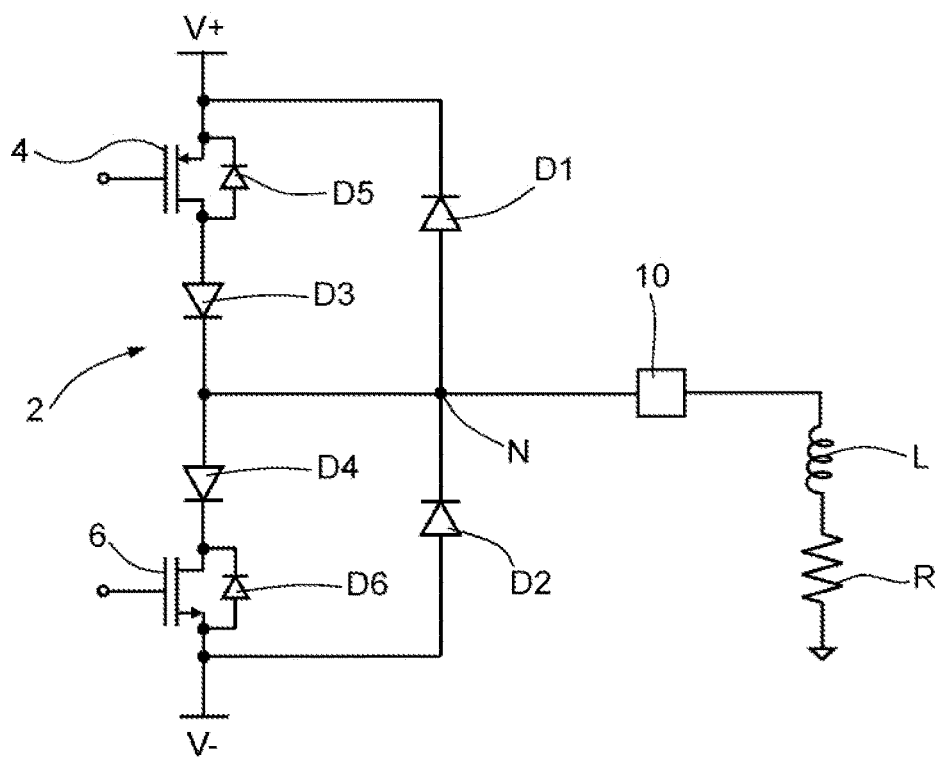
FIG. 1 shows a circuit diagram of a circuit for driving an inductive-resistive load, of a known type.
Figure 2:
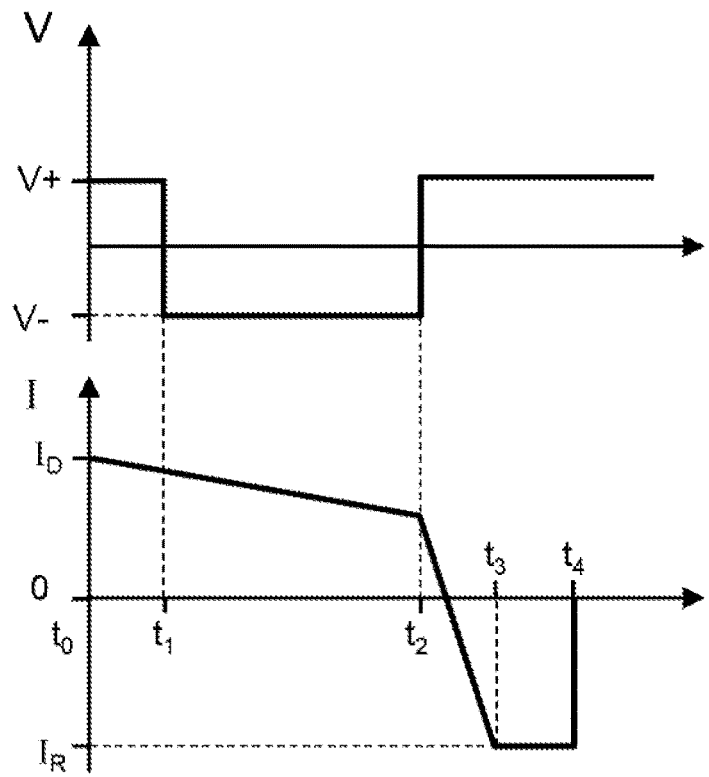
FIG. 2 is a qualitative time plot of a voltage and of a current in the circuit shown in FIG. 1.

The diode 12 may be used to implement any of the diodes D1-D4 of the control stage 2 of the output circuit depicted in FIG. 1 in order to produce a control stage and output circuit according to some embodiments of the present disclosure. Moreover, the MOSFET 20 according to the various embodiments discussed herein may be used to implement either of the MOSFETs 4, 6 of the control stage 2 of the output circuit depicted in FIG. 1 in order to produce a control stage and output circuit according to some embodiments of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process, comprising:
   manufacturing an integrated electronic device, the manufacturing including:
   forming a first electrode region, having a first type of conductivity, in a semiconductor body;
   forming a second electrode region, having a second type of conductivity, in the semiconductor body, the second electrode region forming a junction with the first electrode region;
   forming a nanostructured semiconductor region extending in one of said first and second electrode regions; and
   forming an insulation region of dielectric material, which extends in said second electrode region and is laterally positioned with respect to said first electrode region, wherein said forming the nanostructured semiconductor region comprises forming said nanostructured semiconductor region to extend underneath and contact said insulation region.

2. The process according to claim 1, wherein:
   said forming the first electrode region and forming the second electrode region are such that the first and second electrode regions have, respectively, a first minimum doping level and a second minimum doping level, said second minimum doping level being lower than the first minimum doping level; and
   said forming the nanostructured semiconductor region is such that the nanostructured semiconductor region extends in the second electrode region.

3. The process according to claim 1, further comprising:
   forming a top region, having the first type of conductivity, on a semiconductor substrate, the top region being a portion of the semiconductor body and having a front surface; and
   forming a trench in the top region starting from the front surface; wherein:
   said forming the nanostructured semiconductor region comprises carrying out an electrochemical etch of a part of said top region that defines a bottom of said trench; and
   said forming the insulation region includes forming the insulation region in said trench.

4. The process according to claim 3, further comprising:
   after forming said nanostructured semiconductor region, carrying out an implantation of dopant species of the second type of conductivity in said top region, to a depth greater than the depth of said nanostructured semiconductor region.

5. The process according to claim 3, wherein forming the trench comprises forming a first hard mask on the front surface and selectively etching, through said first hard mask, said top region, said process further comprising:
   after forming said trench, forming a thermal-oxide layer that coats lateral walls and the bottom of the trench;
   forming a second hard mask that coats the first hard mask and said thermal-oxide layer;
   through said second hard mask, selectively removing a portion of said thermal-oxide layer that coats the bottom of the trench to form a first window that is delimited by exposed portions of the thermal-oxide layer and exposes a first portion of said top region;
   coating with a protective layer the second hard mask, the exposed portions of the thermal-oxide layer and said first portion of said top region;
   selectively removing a portion of the protective layer to form a second window that exposes a second portion of said top region, wherein carrying out said electrochemical etch includes carrying out said electrochemical etch through the second window; and
   removing residual portions of said protective layer after carrying out said electrochemical etch.

6. The process according to claim 5, further comprising:
   removing the second hard mask; and
   depositing in the trench a dielectric filling region after removing said second hard mask, the dielectric filling region being in contact with the nanostructured semiconductor region and with residual portions of the thermal-oxide layer and forming at least part of the insulation region.

7. The process according to claim 1, further comprising:
   forming a top region having the first type of conductivity, delimited by a front surface;
   forming a top region, having the first type of conductivity, on a semiconductor substrate, the top region being a portion of the semiconductor body and having a front surface; and
   forming a trench in the top region starting from the front surface;
   in the trench, forming a preliminary insulation region, which includes a thermal-oxide layer, which coats lateral walls and a bottom of the trench, and a preliminary inner dielectric region, which is surrounded laterally and at a bottom by the thermal-oxide layer;
   carrying out an implantation of dopant species of the second type of conductivity in the top region, to a depth greater than the depth of the trench, for forming an implanted region that extends to the front surface;
   selectively removing a portion of the preliminary inner dielectric region and an underlying portion of the thermal-oxide layer to form a first opening, which is delimited by exposed portions of the preliminary inner dielectric region and of the thermal-oxide layer and extends to a portion of the implanted region, which, in turn, extends to the bottom of the trench;
   carrying out a selective implantation of dopant species of the first type of conductivity in the portion of the implanted region to form an intermediate region having the first type of conductivity;
   coating with a protective layer the intermediate region and the exposed portions of the preliminary inner dielectric region and of the thermal-oxide layer; and
   selectively removing a portion of the protective layer for forming a second opening that extends to the intermediate region, wherein forming the nanostructured semiconductor region comprises carrying out an electrochemical etch of the intermediate region; and after forming the nanostructured region, removing residual portions of the protective layer, wherein forming the insulation region includes filling the first opening with a dielectric filling region after removing the residual portions of the protective layer.

8. The process according to claim 1, wherein the first and second types of conductivity are, respectively, a conductivity of a P type and a conductivity of an N type.

9. A process, comprising:
manufacturing an integrated electronic device in a semiconductor body, the manufacturing including:
forming a first electrode region, having a first type of conductivity and a first doping level, in the semiconductor body;
forming a second electrode region having a second type of conductivity in the semiconductor body, the second electrode region forming a junction with the first electrode region; and
forming a nanostructured semiconductor region which extends in one of the first and second electrode regions, wherein forming the second electrode region includes:
forming a first subregion arranged at a distance from the first electrode region; and
forming a second subregion arranged between the first subregion and the first electrode region and contacting the first subregion and the first electrode region, the second subregion having a second doping level that is less than the first doping level and less than a third doping level of the first subregion; and wherein the nanostructured semiconductor region extends at least in part within the second subregion.

10. The process according to claim 9, wherein the nanostructured semiconductor region extends entirely within the second subregion.

11. The process according to claim 9, wherein manufacturing the integrated electronic device includes forming an insulation region of dielectric material, which extends within the second electrode region and is laterally spaced apart from the first electrode region; and wherein the nanostructured semiconductor region extends underneath and in direct contact with the insulation region.

12. The process according to claim 11, wherein:
the semiconductor body has a front surface;
manufacturing the integrated electronic device includes forming a trench in the semiconductor body starting from the front surface;
forming the nanostructured semiconductor region comprises carrying out an electrochemical etch of a part of the semiconductor body that defines a bottom of the trench; and
forming the insulation region includes forming the insulation region in the trench.

13. The process according to claim 12, manufacturing the integrated electronic device includes:
after forming the nanostructured semiconductor region, carrying out an implantation of dopant species of the second type of conductivity in the top region, to a depth greater than the depth of the nanostructured semiconductor region.

14. The process according to claim 12, wherein:
forming the trench comprises forming a first hard mask on the front surface and selectively etching, through the first hard mask, the semiconductor body; and
manufacturing the integrated electronic device includes:
after forming the trench, forming a thermal-oxide layer that coats lateral walls and the bottom of the trench;
forming a second hard mask that coats the first hard mask and the thermal-oxide layer;
through the second hard mask, selectively removing a portion of the thermal-oxide layer that coats the bottom of the trench to form a first window that is delimited by exposed portions of the thermal-oxide layer and exposes a first portion of the semiconductor body;
coating with a protective layer the second hard mask, the exposed portions of the thermal-oxide layer and the first portion of the semiconductor body;
selectively removing a portion of the protective layer to form a second window that exposes a second portion of the semiconductor body, wherein carrying out the electrochemical etch includes carrying out the electrochemical etch through the second window; and
removing residual portions of the protective layer after carrying out the electrochemical etch.

15. The process according to claim 14, wherein manufacturing the integrated electronic device includes:
removing the second hard mask; and
depositing in the trench a dielectric filling region after removing the second hard mask, the dielectric filling region being in contact with the nanostructured semiconductor region and with residual portions of the thermal-oxide layer and forming at least part of the insulation region.

16. A process, comprising:
manufacturing an integrated electronic device in a semiconductor body having a front surface, the manufacturing including:
forming a trench in the semiconductor body starting from the front surface;
forming a nanostructured semiconductor region in the semiconductor body, wherein forming the nanostructured semiconductor region includes carrying out an electrochemical etch of a part of the top region that defines a bottom of the trench; and
forming an insulation region of dielectric material in the trench after forming the nanostructured semiconductor region.

17. The process according to claim 16, wherein the manufacturing includes:
forming a first electrode region, having a first type of conductivity, in the semiconductor body; and
forming a second electrode region, having a second type of conductivity, in the semiconductor body, the second electrode region forming a junction with the first electrode region.

18. The process according to claim 16, wherein manufacturing the integrated electronic device includes:
after forming the nanostructured semiconductor region, carrying out an implantation of dopant species in the semiconductor body, to a depth greater than a depth of the nanostructured semiconductor region.

19. The process according to claim 16, wherein:
forming the trench comprises forming a first hard mask on the front surface and selectively etching, through the first hard mask, the semiconductor body; and
manufacturing the integrated electronic device includes:
after forming the trench, forming a thermal-oxide layer that coats lateral walls and the bottom of the trench;
forming a second hard mask that coats the first hard mask and the thermal-oxide layer;

through the second hard mask, selectively removing a portion of the thermal-oxide layer that coats the bottom of the trench to form a first window that is delimited by exposed portions of the thermal-oxide layer and exposes a first portion of the top region;

coating with a protective layer the second hard mask, the exposed portions of the thermal-oxide layer and the first portion of the top region;

selectively removing a portion of the protective layer to form a second window that exposes a second portion of the top region, wherein carrying out the electrochemical etch includes carrying out the electrochemical etch through the second window; and removing residual portions of the protective layer after carrying out the electrochemical etch.

20. The process according to claim 19, wherein forming the insulation region includes:

removing the second hard mask; and depositing in the trench a dielectric filling region after removing the second hard mask, the dielectric filling region being in contact with the nanostructured semiconductor region and with residual portions of the thermal-oxide layer.

* * * * *